(12) United States Patent
Obata

(10) Patent No.: US 10,122,343 B2
(45) Date of Patent: Nov. 6, 2018

(54) RESONATOR DEVICE, OSCILLATOR, ELECTRONIC APPARATUS, AND VEHICLE

(71) Applicant: Seiko Epson Corporation, Tokyo (JP)

(72) Inventor: Naohisa Obata, Minowa (JP)

(73) Assignee: Seiko Epson Corporation (JP)

( * ) Notice: Subject to any disclaimer, the term of this patent is extended or adjusted under 35 U.S.C. 154(b) by 216 days.

(21) Appl. No.: 15/285,754

(22) Filed: Oct. 5, 2016

(65) Prior Publication Data

US 2017/0099040 A1  Apr. 6, 2017

(30) Foreign Application Priority Data

Oct. 6, 2015 (JP) ................... 2015-198262

(51) Int. Cl.
| | |
|---|---|
| *H03H 9/19* | (2006.01) |
| *H03H 9/25* | (2006.01) |
| *H03K 3/01* | (2006.01) |
| *H03H 9/02* | (2006.01) |
| *H03H 9/05* | (2006.01) |
| *H03H 9/10* | (2006.01) |
| *H03H 9/17* | (2006.01) |

(52) U.S. Cl.
CPC .......... *H03H 9/19* (2013.01); *H03H 9/02133* (2013.01); *H03H 9/0519* (2013.01); *H03H 9/1021* (2013.01); *H03H 9/17* (2013.01); *H03H 9/25* (2013.01); *H03K 3/01* (2013.01)

(58) Field of Classification Search
CPC .............. H03H 9/19; H03H 9/25; H03K 3/01
See application file for complete search history.

(56) References Cited

U.S. PATENT DOCUMENTS

| | | | |
|---|---|---|---|
| 2008/0231145 A1* | 9/2008 | Nagano ................. | B22F 1/0074 310/344 |
| 2016/0197595 A1* | 7/2016 | Obata .................. | H03H 9/1021 331/158 |

FOREIGN PATENT DOCUMENTS

| | | |
|---|---|---|
| JP | 2010-087715 A | 4/2010 |
| JP | 2014-086842 A | 5/2014 |

* cited by examiner

*Primary Examiner* — Jeffrey Shin
(74) *Attorney, Agent, or Firm* — Harness, Dickey & Pierce, P.L.C.

(57) ABSTRACT

A resonator device includes a substrate, a resonator element including a base member having first and second surface, and a pair of excitation electrodes, and first and second bonding member. Defining center of the first and second bonding member as a first and second bonding center, a center of a resonating region as a resonating region center, and defining a distance between the first bonding center and the second bonding center as L1, a length of a perpendicular drawn from the resonating region center to an imaginary line connecting the first bonding center and the second bonding center to each other as L2, a linear expansion coefficient of the first metal layer, the second metal layer, and the base member as α1, α2, α3 respectively, and a length of the resonator element as L3, $0 < L1/L2 \le 0.97$, $|(\alpha 2-\alpha 1)/\alpha 1| \le 0.35$, $|(\alpha 3-\alpha 1)/\alpha 1| \le 0.35$, and $L3 \le 1.5$ mm are satisfied.

8 Claims, 18 Drawing Sheets

DISTANCE FROM INTERSECTION POINT 53 (mm)

FIG. 11B
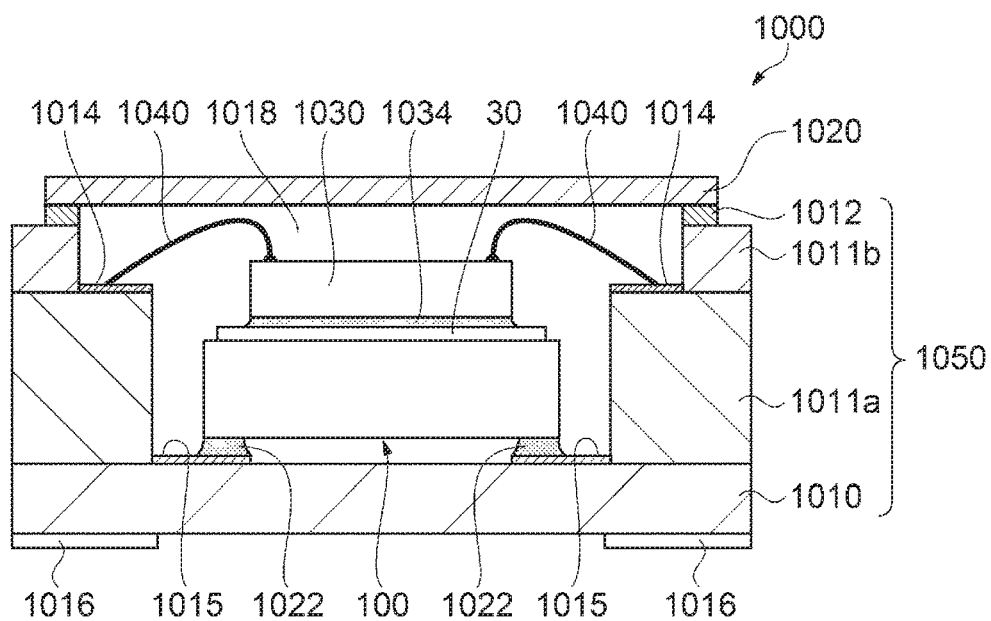
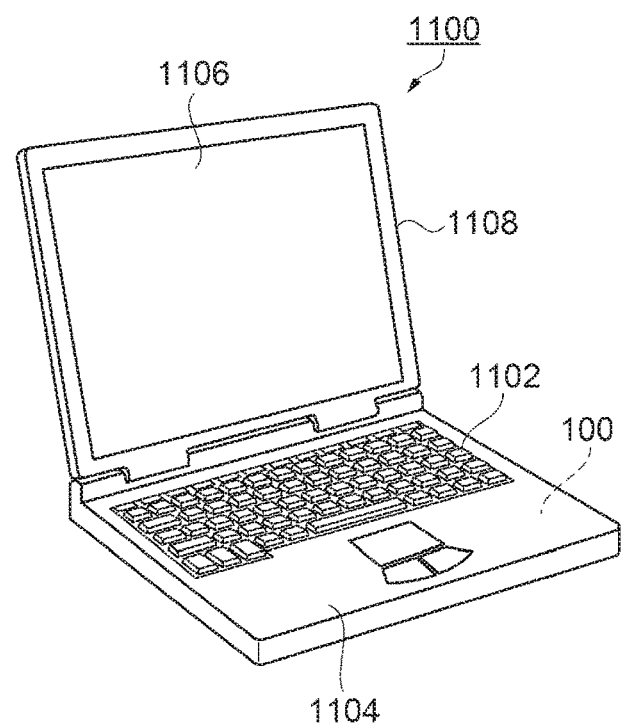
FIG. 12

RESONATOR DEVICE, OSCILLATOR, ELECTRONIC APPARATUS, AND VEHICLE

This application claims priority to Japanese Patent Application No. 2015-198262, filed Oct. 6, 2015, the entirety of which is hereby incorporated by reference.

BACKGROUND

1. Technical Field

The present invention relates to a resonator device, an oscillator, an electronic apparatus, and a vehicle.

2. Related Art

In the communication equipment field, there has been used a resonator device such as a quartz crystal resonator or a quartz crystal oscillator, which uses a resonator element formed of a piezoelectric material such as quartz crystal to output a signal with a desired frequency, in order to obtain a signal with a stable frequency. As described in, for example, JP-A-2014-86842, there has been disclosed a configuration of providing a mound to an electrode pad in a container to stably ensure the thickness of an electrically-conductive adhesive in a resonator device having a resonator element supported by a connection pad so as to form a cantilever. In this configuration, there is disclosed a resonator device capable of reducing a variation of the frequency characteristic of the resonator device, for example, a so-called hysteresis affecting the reproducibility of the frequency variation with respect to the temperature change, by making the heat to be transferred from the outside of the container to the resonator element via the electrically-conductive adhesive hard to be transferred to thereby decrease the temperature gradient in the resonator element.

However, in the resonator device shown in JP-A-2014-86842, the hysteresis as the variation of the frequency characteristic of the resonator device varies due to the stress applied to the resonator element due to a change in ambient temperature of the resonator device besides the heat transferred from the outside of the container. The stress applied to the resonator element due to the change in ambient temperature of the resonator device is also affected by a distance between connection members for connecting the resonator element and the container to each other, and a positional relationship between the connection members and excitation electrodes of the resonator element. Further, it results that the smaller in size the resonator element is made in order to apply the resonator element to a resonator device smaller in size, the more significantly the stress is affected by the distance between the connection members and the positional relationship between the connection members and the excitation electrodes of the resonator element. For example, it is conceivable that the hysteresis in such a small-sized resonator element as having a size (length) in the direction, in which the connection members are arranged, of no larger than 1.5 mm is significantly affected by the positional relationship between the excitation electrodes and the connection members, the material (linear expansion coefficient) of the excitation electrodes, and so on. Therefore, only by stably ensuring the thickness of the electrically-conductive adhesive for connecting the container and the resonator element to each other as in the resonator device of JP-A-2014-86842, there is a possibility that the characteristic variation, for example, the hysteresis or the like of the resonator device becomes large.

SUMMARY

An advantage of some aspects of the invention is to solve at least a part of the problems described above, and the invention can be implemented as the following aspects or application examples.

Application Example 1

A resonator device according to this application example includes a substrate, a resonator element having a resonating region sandwiched by a pair of excitation electrodes respectively disposed on obverse and reverse surfaces of a base member, and a first bonding member and a second bonding member arranged in a first direction along a first side of the resonator element, and adapted to bond the substrate and the resonator element to each other, the excitation electrodes include a first metal layer disposed on the base member side, and a second metal layer disposed on an opposite side of the first metal layer to the substrate side, defining a center of a surface on the resonator element side of the first bonding member as a first bonding center, a center of a surface on the resonator element side of the second bonding member as a second bonding center, a center of the resonating region viewed from one of the pair of excitation electrodes as a resonating region center, and defining a distance between the first bonding center and the second bonding center as L1, a length of a perpendicular drawn from the resonating region center to an imaginary line connecting the first bonding center and the second bonding center to each other as L2, a linear expansion coefficient of the first metal layer as $\alpha 1$, a linear expansion coefficient of the second metal layer as $\alpha 2$, a linear expansion coefficient of the base member as $\alpha 3$, and a length in the first direction of the resonator element as L3, $0 < L1/L2 \leq 0.97$, $|(\alpha 2 - \alpha 1)/\alpha 1| \leq 0.35$, $|(\alpha 3 - \alpha 1)/\alpha 1| \leq 0.35$, and $L3 \leq 1.5$ mm are satisfied.

According to this application example, since the linear expansion coefficient of the excitation electrodes (the first metal layer and the second metal layer) is close to the linear expansion coefficient of the base member, even in the case in which, for example, the ambient temperature of the resonator device has changed, the stress generated between the first metal layer and the base member and the stress generated between the first metal layer and the second metal layer can be reduced. Further, since the ratio L1/L2 satisfies $0 < L1/L2 \leq 0.97$, it becomes hard for the stress, which has been generated in the case in which the base member is deformed due to thermal expansion or the like, to be transmitted to the excitation electrodes, namely the resonating region of the resonator element. Since the characteristics of the resonator element such as the output frequency, the frequency-temperature characteristic, and the equivalent series resistance largely vary in accordance with the state of the resonating region, by reducing the stress transmitted to the resonating region, the characteristic variation of the resonator device can be reduced. Thus, even in such a small-sized resonator element that the length dimension L3 in the direction (the first direction) in which the first bonding member and the second bonding member are arranged is equal to or shorter than 1.5 mm, it becomes hard to be affected by the change in stress in the case in which the ambient temperature of the resonator device has changed, and it is possible to reduce the characteristic variation of the resonator device such as the variation of the frequency-temperature characteristic or the hysteresis.

Application Example 2

In the resonator device according to the application example, it is preferable that $0 < L1/L2 \leq 0.85$ is satisfied.

According to this application example, in the case in which, for example, the stress has occurred due to the difference between the amount of expansion or contraction of the resonator element and the amount of expansion or contraction of the substrate due to the change in ambient temperature of the resonator device, by satisfying the relationship of $0<L1/L2\leq0.85$, it is possible to further reduce the transmission of the stress having occurred due to the difference between the amount of expansion or contraction of the resonator element and the amount of expansion or contraction of the substrate to the resonating region of the resonator element. Therefore, by further reduce the stress transmitted to the resonating region of the resonator element, it is possible to further reduce the characteristic variation of the resonator device such as the hysteresis.

Application Example 3

In the resonator device according to the application example, it is preferable that the resonator element includes a first region having a first thickness in a direction crossing the obverse and reverse surfaces, and a second region having a thickness thinner than the first thickness, and the resonating region center overlaps the first region in the planar view, and the first bonding center and the second bonding center overlap the second region in the planar view.

According to this application example, the stress occurring due to the difference between the amount of expansion or contraction of the resonator element and the amount of expansion or contraction of the substrate due to the change in ambient temperature of the resonator device is transmitted to the resonating region via the second region. However, the second region is thinner than the first region, and is therefore easily deflected. Therefore, since the stress occurs due to the difference between the amount of expansion or contraction of the resonator element and the amount of expansion or contraction of the substrate due to the change in ambient temperature of the resonator device is absorbed by the second region deflected more largely than the first region. Therefore, it is possible to further reduce the stress transmitted to the resonating region of the resonator element, and thus, it is possible to further reduce the characteristic variation of the resonator device such as the variation of the frequency-temperature characteristic or the hysteresis.

Application Example 4

In the resonator device according to the application example, it is preferable that defining a length dimension of the resonator element in a direction crossing the first direction as L4, $L4\leq1.8$ mm is satisfied.

According to this application example, in the case in which, for example, the stress has occurred due to the difference between the amount of expansion or contraction of the resonator element and the amount of expansion or contraction of the substrate due to the change in ambient temperature of the resonator device, by making the length dimension L4 in the direction crossing the first direction of the resonator element satisfy the relationship of $L4\leq1.8$ mm, the distance from the first bonding center and the second bonding center to the resonating region becomes long. Thus, it is possible to further reduce the transmission of the stress, which has occurred due to the difference between the amount of expansion or contraction of the resonator element and the amount of expansion or contraction of the substrate, to the resonating region of the resonator element. Therefore, by further reduce the stress transmitted to the resonating region of the resonator element, it is possible to further reduce the characteristic variation of the resonator device such as the hysteresis.

Application Example 5

In the resonator device according to the application example, it is preferable that the base member is made of a quartz crystal, the first metal layer is made of one of nickel (Ni) and an alloy including nickel (Ni) as a principal component, and the second metal layer is made of one of gold (Au) and an alloy including gold (Au) as a principal component.

According to this application example, by using nickel (Ni) having good adhesion with the quartz crystal, which is the base member, as the first metal layer, and using gold (Au) hardly altered and high in stability as the second metal layer, it is possible to obtain the excitation electrodes with higher stability. Thus, it is possible to suppress the characteristic change of the resonator element.

Application Example 6

An oscillator according to this application example includes the resonator device according to any one of the application examples described above, a circuit element provided with an oscillation circuit adapted to oscillate the resonator device, a container, a first lid member, and a second lid member, the resonator element, the first bonding member, and the second bonding member are housed in an internal space defined by the substrate and the first lid member, the circuit element is connected on the first lid member via a connection member, and the resonator device, the first lid member, and the circuit element are housed in the container and sealed by the second lid member.

According to this application example, the resonator device, which has the resonator element, the first bonding member, and the second bonding member housed in the internal space defined by the substrate and the first lid member, is encapsulated in the container together with the circuit element. In such a manner, the resonator element, the first bonding member, and the second bonding member are doubly encapsulated by a first package provided with the internal space defined by the substrate and the first lid member, and the container (a second package) in which the resonator device is encapsulated together with the circuit element. Due to such double encapsulation as described above, even in the case in which the ambient temperature of the oscillator has changed, it becomes hard for the change in temperature to be propagated to the resonator element, the first bonding member, and the second bonding member, and thus, it is possible to further reduce the characteristic variation of the resonator device such as hysteresis. Therefore, it becomes possible to provide the oscillator more stable in characteristics.

Application Example 7

An electronic apparatus according to this application example includes the resonator device according to any one of the application examples described above.

According to this application example, by using the resonator device the characteristic variation of which is reduced by reducing the transmission of the stress, which occurs due to the difference between the amount of expansion or contraction of the resonator element and the amount of expansion or contraction of the substrate due to the change in ambient temperature of the resonator device, to the resonator element, it is possible to realize the electronic apparatus, which is small in characteristic variation, for example, reduced in variation of the frequency-temperature characteristic, the hysteresis, and so on, and is therefore high in reliability.

Application Example 8

A vehicle according to this application example includes the resonator device according to any one of the application examples described above.

According to this application example, by using the resonator device the characteristic variation of which is reduced by reducing the transmission of the stress, which occurs due to the difference between the amount of expansion or contraction of the resonator element and the amount of expansion or contraction of the substrate due to the change in ambient temperature of the resonator device, to the resonator element, it is possible to realize the vehicle, which is small in characteristic variation, for example, reduced in variation of the frequency-temperature characteristic, the hysteresis, and so on, and is therefore high in reliability.

BRIEF DESCRIPTION OF THE DRAWINGS

The invention will be described with reference to the accompanying drawings, wherein like numbers reference like elements.

FIG. 11B is a cross-sectional view along the line H-H in FIG. 11A.

FIG. 12 is a perspective view showing a configuration of a mobile type (or laptop type) personal computer as an electronic apparatus according to a seventh embodiment of the invention.

DESCRIPTION OF EXEMPLARY EMBODIMENTS

Figure 1A:
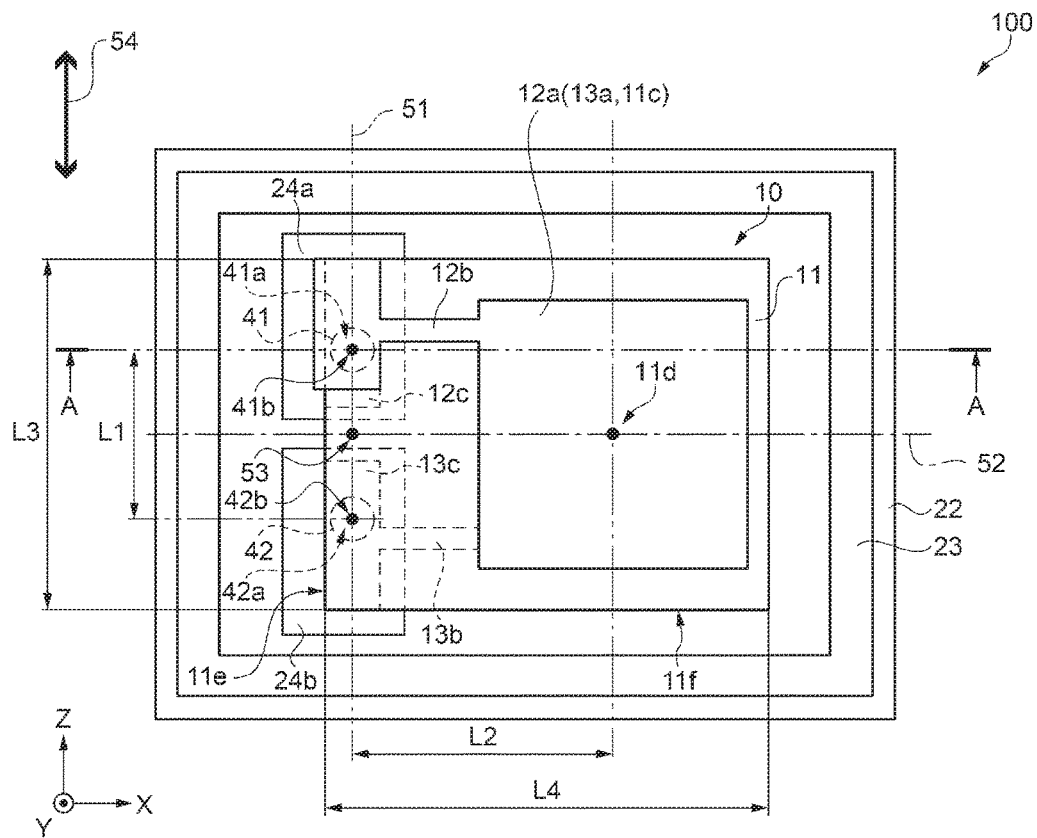
FIG. 1A is a plan view showing a schematic configuration of a quartz crystal resonator as a resonator device according to a first embodiment of the invention.

An embodiment of the invention will hereinafter be described with reference to the accompanying drawings. It should be noted that in each of the drawings described below, the scale sizes of the layers and the members are made different from the actual dimensions in order to make the layers and the members have recognizable dimensions. Further, hereinafter, for the sake of convenience of explanation, in the drawings, an X axis, a Y axis, and a Z axis are shown as three axes perpendicular to each other, and a direction parallel to the X axis is referred to as an "X-axis direction," a direction parallel to the Y axis is referred to as a "Y-axis direction," and a direction parallel to the Z axis is referred to as a "Z-axis direction." Further, in the drawings described hereinafter, the explanation is presented assuming the upper side (the +Y-axis direction) in the drawings as an "upper side," and the lower side (the −Y-axis direction) as a "lower side." Further, the explanation will be presented assuming a surface located on the upper side of each member in the drawings as an upper surface, and a surface located on the lower side as a lower surface.

First Embodiment

Figure 1B:
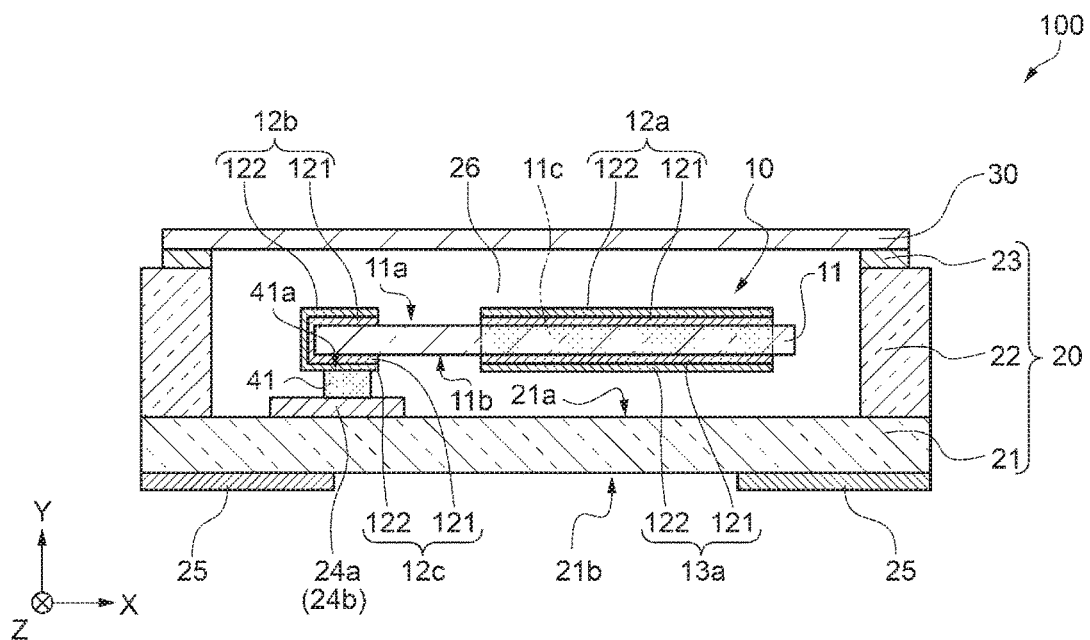
FIG. 1B is a cross-sectional view along the line A-A in FIG. 1A.
Figure 2:
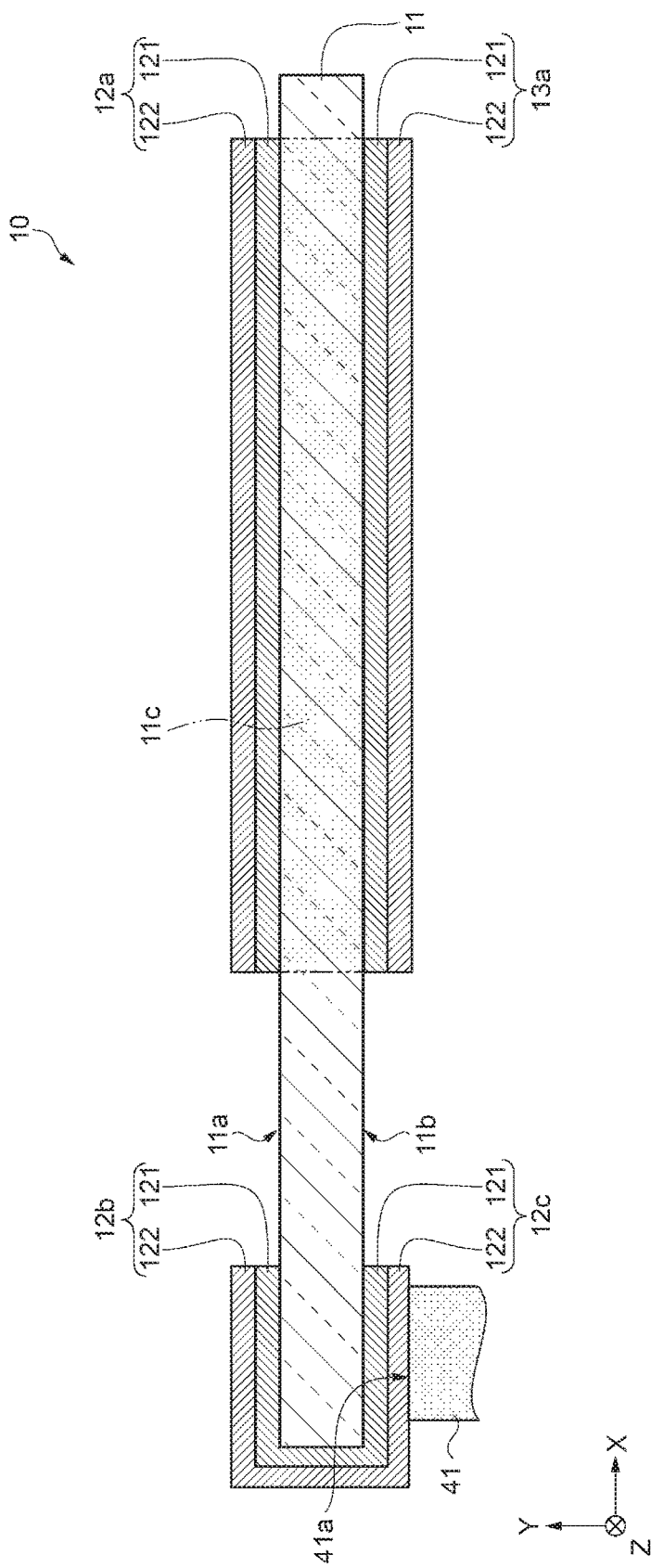
FIG. 2 is a partial enlarged view (cross-sectional view) of a resonator element shown in FIG. 1B.

Firstly, a quartz crystal resonator as an example of the resonator device according to a first embodiment of the invention will be described with reference to FIG. 1A, FIG. 1B, and FIG. 2. FIG. 1A is a plan view showing a schematic configuration of the quartz crystal resonator as the resonator device according to the first embodiment. FIG. 1B is a cross-sectional view along the line A-A shown in FIG. 1A. FIG. 2 is a partial enlarged view (cross-sectional view) of a resonator element shown in FIG. 1B. It should be noted that the quartz crystal resonator 100 according to the first embodiment is a resonator device oscillating with a predetermined frequency due to a predetermined alternating-current voltage applied from the outside.

Quartz Crystal Resonator

Firstly, a general configuration of the quartz crystal resonator 100 as the resonator device according to the first embodiment will be described. The quartz crystal resonator 100 is constituted by a resonator element 10, a package 20 including a substrate, a first bonding member 41, a second bonding member 42, a lid 30 as a lid member, and so on. It should be noted that in FIG. 1A, the lid 30 is omitted from the drawing for the sake of convenience of explanation.

Resonator Element

The resonator element 10 includes a quartz crystal substrate 11 as a base member formed of quartz crystal as a type of piezoelectric single crystal, a pair of excitation electrodes 12a, 13a, extraction electrodes 12b, 13b, and connection electrodes 12c, 13c. A predetermined alternating-current voltage is applied to the excitation electrodes 12a, 13a, and thus, the resonator element 10 vibrates with a predetermined resonance frequency.

As the quartz crystal substrate 11 in the present embodiment, there can be used, for example, an AT-cut quartz crystal substrate. In the case of the AT-cut quartz crystal substrate, the Y axis and the Z axis are both rotated roughly 35°15' using the X axis as the rotational axis to thereby obtain a Y' axis and a Z' axis, respectively. Therefore, the AT-cut quartz crystal substrate has the X axis, the Y' axis, and Z' axis as the crystal axes perpendicular to each other. In the AT-cut crystal substrate, the thickness direction is along the Y'-axis direction, the principal surface is a surface including the X-Z' plane (the plane including the X axis and the Z' axis) perpendicular to the Y' axis, and the AT-cut quartz crystal substrate vibrates with the thickness-shear vibration as the principal vibration. It should be noted that although the Y-axis direction and the X-axis direction are shown in the drawings, the Y-axis direction and the X-axis direction correspond to the Y' axis and the Z' axis of the quartz crystal substrate 11, respectively. It should be noted that the quartz crystal substrate is not limited to the AT-cut quartz crystal substrate, but a BT-cut quartz crystal substrate, an SC-cut quartz crystal substrate, or the like can also be used.

The quartz crystal substrate 11 as the base member has an upper surface (an obverse surface, a first surface) 11a and a lower surface (a reverse surface, a second surface) 11b as the both sides opposite to each other, and a first side 11e. The quartz crystal substrate 11 has a rectangular shape in a planar view, namely viewed from above (in the Y-axis direction), and has the first side 11e, and a second side 11f along a direction crossing the first side 11e. The quartz crystal substrate 11 is a small-sized base member fulfilling L3≤1.5 mm defining the length of the first side 11e as L3, and the length of the second side 11f as L4.

Further, it is preferable to further make the length dimension of the second side 11f satisfy the relationship of L4≤1.8 mm. By adopting such a length dimension of the second side 11f, the distances from a first bonding center 41b and a second bonding center 42b described later to a resonating region 11c become long. Therefore, even if the stress is caused by, for example, a difference between an amount of expansion or contraction of the resonator element 10 due to the change in ambient temperature of the quartz crystal resonator 100 and an amount of expansion or contraction of a bottom plate (a substrate) 21 (see FIG. 1B) of the package 20 described later, it is possible to reduce the transmission of the stress, which has occurred due to the difference between the amount of expansion or contraction of the resonator element 10 and the amount of expansion or contraction of the bottom plate 21, to the resonating region 11c of the quartz crystal substrate 11 described later. Therefore, it is possible to reduce the stress transmitted from the bonding part between the first bonding member 41 or the second bonding member 42 and the quartz crystal substrate 11 to the resonating region 11c. Thus, it is possible to reduce the characteristic variation, for example, the hysteresis of the quartz crystal resonator 100.

On the upper surface 11a of the quartz crystal substrate 11, there are formed the excitation electrode 12a and the extraction electrode 12b. On the lower surface 11b of the quartz crystal substrate 11, there are formed the excitation electrode 13a, the extraction electrode 13b, and the connection electrodes 12c, 13c. Further, the connection electrodes 12c, 13c are disposed on the first side 11e side of the lower surface 11b of the quartz crystal substrate 11 so as to be arranged side by side in the first direction (the Z-axis direction) 54. The extraction electrode 12b extends from the excitation electrode 12a to the connection electrode 12c via a side surface connecting the upper surface 11a and the lower surface 11b, and electrically connects the excitation electrode 12a and the connection electrode 12c to each other. The extraction electrode 13b extends from the excitation electrode 13a to the connection electrode 13c to electrically connect the excitation electrode 13a and the connection electrode 13c to each other.

The excitation electrodes 12a, 13a each have a rectangular shape in a planar view, namely viewed from above (from the Y-axis direction), and are arranged so as to roughly overlap each other, and are arranged so that the center of the excitation electrode 12a and the center of the excitation electrode 13a roughly overlap each other. Further, the quartz crystal substrate 11 is provided with the resonating region 11c sandwiched by the excitation electrodes 12a, 13a. Here, the centers of the excitation electrodes 12a, 13a are the centroids of the shapes of the excitation electrodes 12a, 13a viewed from above, respectively.

Although in the present embodiment, the center of the excitation electrode 12a and the center of the excitation electrode 13a are arranged so as to roughly overlap each other, this is not a limitation. It is sufficient for the excitation electrode 12a and the excitation electrode 13a to overlap each other viewed from above to have the resonating region 11c. It should be noted that the excitation electrodes 12a, 13a can each have a circular shape, an elliptical shape, a polygonal shape such as a triangular shape, and so on, and have a shape obtained by rounding the corners of the polygonal shape, besides the rectangular shape.

The excitation electrodes 12a, 13a, the extraction electrodes 12b, 13b, and the connection electrodes 12c, 13c are formed using a method such as a vapor deposition method, a sputtering method, or a plating method, a method of applying a paste (a solvent) including a metal material, and then evaporating the solvent component other than the metal, or the like. Further, the excitation electrodes 12a, 13a, the extraction electrodes 12b, 13b, and the connection electrodes 12c, 13c are each formed of at least two layers including a foundation layer (a first metal layer 121) and an upper layer (a second metal layer 122). The first metal layer 121 as the foundation layer is disposed on the quartz crystal substrate 11, namely on the quartz crystal substrate 11 side, and the second metal layer 122 as the upper layer is disposed on the first metal layer 121, namely on the opposite side to the quartz crystal substrate 11 side.

As the constituent materials of the first metal layer 121 and the second metal layer 122, there are used materials satisfying $|(\alpha2-\alpha1)/\alpha1|\leq0.35$ and $|(\alpha3-\alpha1)/\alpha1|\leq0.35$ defining the linear expansion coefficient of the first metal layer 121 as $\alpha1$, the linear expansion coefficient of the second metal layer 122 as $\alpha2$, and the linear expansion coefficient of the quartz crystal substrate 11, which is a base member of the resonator element 10, as $\alpha3$. Further, as the constituent material of the first metal layer 121, there can be cited a material having an adhesion property with respect to the quartz crystal substrate 11, and as the constituent material of the second metal layer 122, there can be cited a material having particularly high electrical conductivity.

Specifically, as the constituent material of the first metal layer 121, there can be used at least one of nickel (Ni), beryllium (Be), scandium (Sc), iron (Fe), cobalt (Co), bismuth (Bi), barium (Ba), and gallium (Ga), or an alloy having at least one of these metals as a principal component. Further, specifically, as the constituent material of the second metal layer 122, there can be used at least one of gold (Au), silver (Ag), and copper (Cu), or an alloy having at least one of these metals as a principal component.

More preferably, by using nickel (Ni), which is easy to obtain, and has good adhesion to the quartz crystal substrate 11, as the constituent material of the first metal layer 121, and using gold (Au) hard to alter and high in stability as the constituent material of the second metal layer 122, the excitation electrodes can be made more stable.

In this case, the linear expansion coefficient $\alpha1$ of nickel (Ni) is 13.3 $(1/^\circ C.\times10^{-6})$, and the linear expansion coefficient $\alpha2$ of gold (Au) is 14.2 $(1/^\circ C.\times10^{-6})$. Further, the linear expansion coefficient $\alpha3$ in the Y'-axis direction (the direction in which the first bonding member 41 and the second bonding member 42 are arranged) of the quartz crystal substrate 11 as the base member of the resonator element 10 is about 9.5 $(1/^\circ C.\times10^{-6})$. Therefore, $|(\alpha2-\alpha1)/\alpha1|$ and $|(\alpha3-\alpha1)/\alpha1|$ are calculated as follows.

$$|(\alpha2-\alpha1)/\alpha1|=|(14.2-13.3)/13.3|=0.0677$$

$$|(\alpha3-\alpha1)/\alpha1|=|(9.5-13.3)/13.3|=0.2857$$

As described above, in the case of using the quartz crystal substrate 11, nickel (Ni) as the constituent material of the first metal layer 121, and gold (Au) as the constituent material of the second metal layer 122, $|(\alpha2-\alpha1)/\alpha1|=0.0677\leq0.35$ and $|(\alpha3-\alpha1)/\alpha1|=0.2857\leq0.35$ are satisfied.

Since the excitation electrodes 12a, 13a, the extraction electrodes 12b, 13b and the connection electrodes 12c, 13c connected respectively to the excitation electrodes 12a, 13a are each formed of the two layers, namely the first metal layer 121 and the second metal layer 122, as described above, it is possible to make the linear expansion coefficients $\alpha1$, $\alpha2$ of the first metal layer 121 and the second metal layer 122 approach the linear expansion coefficient $\alpha3$ of the quartz crystal substrate 11. Thus, even in the case in which, for example, the ambient temperature of the quartz crystal resonator 100 varies, it is possible to reduce the stress generated between the first metal layer 121 and the quartz crystal substrate 11, and the stress generated between the first metal layer 121 and the second metal layer 122.

The resonating region 11c has a resonating region center 11d. Since in the present embodiment, the excitation electrodes 12a, 13a each have a rectangular shape and are arranged so as to roughly overlap each other when viewed from above, the resonating region 11c has a rectangular shape and the resonating region center 11d and the centers of the excitation electrodes 12a, 13a are roughly overlap each other when viewed from above. Here, the resonating region center 11d is the centroid of the shape of the resonating region 11c viewed from above.

Package

The package 20 is formed of the bottom plate 21 as the substrate, a sidewall 22, a sealing ring 23, and so on. It should be noted that the bottom plate 21 as the substrate has an upper surface 21a and a lower surface 21b.

Specifically, in the package 20, an internal space 26 (a housing space) having a shape recessed in a central part is formed by stacking the sidewall 22 in the peripheral part of the upper surface 21a of the bottom plate 21, and in the internal space 26, there is housed a resonator element 10. The outer shape of the package 20 is not limited, but can also be provided with, for example, a rectangular solid shape or a cylindrical shape.

The bottom plate 21 and the sidewall 22 are preferably formed of a material having a thermal expansion coefficient equal or close to the thermal expansion coefficient of the resonator element 10 and the lid 30, and ceramic is used as the material in the present embodiment.

The sealing ring 23 is formed of, for example, a metal brazing material such as a gold brazing material or a silver brazing material, glass, or metal such as Kovar as the bonding material between the sidewall 22 and the lid 30, and is disposed along the upper surface of the sidewall 22 so as to have a frame shape.

Further, on the upper surface 21a of the bottom plate 21, there are formed internal connection terminals 24a, 24b, and on the lower surface 21b of the bottom surface 21, there is formed a plurality of external connection terminals 25 to be at least electrically connected to a circuit or a mounting board located outside the quartz crystal resonator 100. The internal connection terminals 24a, 24b and the plurality of external connection terminals 25 are obtained by performing, for example, tungsten metalizing, nickel plating, and gold plating in this order.

The internal connection terminals 24a, 24b are electrically connected to the two different external connection terminals 25 out of the plurality of external connection terminals 25 using interconnections (not shown) disposed on the bottom plate 21. Further, the external connection terminals 25 are each an electrode connected at least electrically to the external mounting board (not shown), and used for supplying the resonator element 10 with an alternating-current voltage, or outputting an electric signal such as a frequency signal.

Lid

The lid 30 as a first lid member has a plate-like shape covering the opening of the package 20, and is formed of, for example, metal such as Kovar or 42-alloy, ceramic, or glass.

The lid 30 as the first lid member is bonded to the sealing ring 23 so that the internal space 26 becomes in an airtight state after housing the resonator element 10 in the internal space 26 of the package 20. The inner pressure of the internal space 26 set to the airtight state is set to a desired value. For example, by setting the internal space 26 to a vacuum state (a state of the pressure (lower than $1\times10^5$ Pa through $1\times10^{-10}$ Pa (JIS Z 8126-1:1999)) lower than the atmospheric pressure), or by setting the internal space 26 to a pressure state equivalent to the atmospheric pressure filled with an inert gas such as nitrogen or argon, the resonator element 10 can continue more stable vibration.

It should be noted that the internal space 26 of the present embodiment is sealed in the vacuum state. By sealing the internal space 26 in the vacuum state, the Q-value of the resonator element 10 housed therein is raised, and further, the vibration of the resonator element 10 can continue the stable state.

Bonding Member

The first bonding member 41 and the second bonding member 42 are arranged side by side in the direction in which the first side 11e located on the lower surface 11b of the quartz crystal substrate 11 extends.

The first bonding member 41 and the second bonding member 42 are each formed of resin containing an electrically-conductive material such as an electrically-conductive adhesive. As the electrically-conductive material, there can be cited, for example, fine particles of metal of a metallic element such as gold (Au), silver (Ag), copper (Cu), aluminum (Al), or platinum (Pt), or a mixture including one or more of these metallic elements, resin fine particles plated with the metal described above, and carbon fine particles. Further, as the resin, there is used epoxy-type resin, silicone-type resin, polyimide-type resin, polyamide-type resin, acrylic-type resin, or the like.

The first bonding member 41 is electrically and mechanically connected to the connection electrode 12c, and at the same time electrically and mechanically connected to the internal connection terminal 24a. The second bonding member 42 is electrically and mechanically connected to the connection electrode 13c, and at the same time electrically and mechanically connected to the internal connection terminal 24b. In other words, the resonator element 10 is supported by the bottom plate 21 via the first bonding member 41 and the internal connection terminal 24a, and the second bonding member 42 and the internal connection terminal 24b. Specifically, in an area around the side across the excitation electrodes 12a, 13a from the first side 11e viewed from above, the resonator element 10 does not have contact with the bottom plate 21, the sidewall 22, the sealing ring 23, and the lid 30, but is supported by the bottom plate 21 as a cantilever.

The first bonding member 41 and the second bonding member 42 has electrical conductivity, and can therefore achieve mechanical bonding and electrical bonding between the connection electrode 12c and the internal connection terminal 24a, and between the connection electrode 13c and the internal connection terminal 24b at the same time. Therefore, compared to the case of achieving the mechanical bonding and the electrical bonding between the resonator element 10 and the bottom plate 21 using respective members different from each other, the members used for the resonator device can be reduced, and thus, the quartz crystal resonator 100 can efficiently be manufactured.

The first bonding member 41 has the first bonding center 41b on the connection electrode 12c side, namely on the upper surface 41a located on the resonator element 10 side.

The second bonding member 42 has the second bonding center 42b on the connection electrode 13c side, namely on the upper surface 42a located on the resonator element 10 side.

The first bonding center 41b and the second bonding center 42b are the centroids of the shapes of the first bonding member 41 and the second bonding member 42 viewed from above, namely the shapes of the upper surface 41a and the upper surface 42a viewed from above, respectively. It should be noted that the centroid of the upper surface 41a can be obtained as a point where a cross-sectional first moment becomes zero, wherein the cross-sectional first moment is a value obtained by integrating the values obtained by multiplying the coordinate (x, y) distant from a certain coordinate (x0, y0) by an infinitesimal area dS throughout all of the coordinate points in the outer shape with respect to, for example, the outer shape of the upper surface 41a viewed from above with an image recognition device or the like. The centroid of the upper surface 42a can also be obtained using substantially the same method as in the case of the upper surface 41a.

Then, the relationship between the resonating region 11c, and the first bonding member 41 and the second bonding member 42 will be described.

Firstly, an imaginary line passing through the first bonding center 41b and the second bonding center 42b is defined as a first imaginary straight line 51, and an imaginary line passing through the resonating region center 11d and perpendicular to the first imaginary straight line 51 is defined as a second imaginary straight line 52. It should be noted that an intersection point 53 between the first imaginary straight line 51 and the second imaginary straight line 52 is disposed between the first bonding center 41b and the second bonding center 42b. In other words, the first bonding member 41 and the second bonding member 42 are arranged side by side in the first direction 54 as the direction, in which the first side 11e extends, across the second imaginary straight line 52 viewed from above.

Here, defining the distance from the first bonding center 41b to the second bonding center 42b as L1, the length of a perpendicular drawn from the resonating region center 11d to a line connecting the first bonding center 41b and the second bonding center 42b, namely the distance from the resonating region center 11d to the intersection point 53, as L2, the relationship between L1, L2, and the hysteresis will hereinafter be described.

Firstly, the hysteresis of the quartz crystal resonator 100 will be described. Regarding the resonance frequency of the resonator element 10, the there is provided a characteristic in which the resonance frequency at a predetermined temperature T in the rising process of the ambient temperature of the quartz crystal resonator 100 and the resonance frequency at the predetermined temperature T in the falling process of the ambient temperature of the quartz crystal resonator 100 are different from each other. The fact that there is provided the characteristic different between when the ambient temperature is rising and when the ambient temperature is falling is expressed that there is provided a hysteresis. It is conceivable that the reason therefor is as follows.

In the quartz crystal resonator 100 according to the present embodiment, the resonator element 10 and the bottom plate 21 are not formed of the same material, and are therefore different in linear expansion coefficient, and thus, the amount of expansion or contraction of the resonator element 10 and the amount of expansion or contraction of the bottom plate 21 due to the change in ambient temperature of the quartz crystal resonator 100 are different from each other. Therefore, in the case in which the ambient temperature of the quartz crystal resonator 100 changes, it results that the stress occurs inside the resonator element 10 due to the difference between the amount of expansion or contraction of the resonator element 10 and the amount of expansion or contraction of the bottom plate 21.

Further, since the resonator element 10 is bonded to the inside of the quartz crystal resonator 100, namely the inside of the package 20, via the first bonding member 41 and the second bonding member 42, the change in ambient temperature of the quartz crystal resonator 100 propagates slower the resonator element 10 than the bottom plate 21. Therefore, in the process in which the ambient temperature of the quartz crystal resonator 100 rises, even when the ambient temperature of the quartz crystal resonator 100 reaches the predetermined temperature T, the temperature of the resonator element 10 is in a state lower than the predetermined temperature T, and in the process in which the ambient temperature of the quartz crystal resonator 100 falls, even when the ambient temperature of the quartz crystal resonator 100 reaches the predetermined temperature T, the temperature of the resonator element 10 is in a state higher than the predetermined temperature T.

According to the fact described above, even in the case in which the ambient temperature of the quartz crystal resonator 100 is at the predetermined temperature T, the temperature of the resonator element 10 is different between the process in which the ambient temperature rises and the process in which the ambient temperature falls, and therefore, the amount of expansion or contraction of the resonator element 10 is different. Therefore, the stress occurring in the resonator element 10 due to the difference between the amount of expansion or contraction of the resonator element 10 and the amount of expansion or contraction of the bottom plate 21 is different between the case in which the ambient temperature has reached the predetermined temperature T in the process in which the ambient temperature of the quartz crystal resonator 100 rises, and the case in which the ambient temperature has reached the predetermined temperature T in the process in which the ambient temperature falls.

Further, it has been known the fact that the resonance frequency of the resonator element 10 in the case in which a predetermined alternating-current voltage is applied varies in accordance with the stress applied to the resonator element 10.

Therefore, regarding the resonance frequency of the quartz crystal resonator 100 having the resonator element 10, it results that the resonance frequency at the temperature T in the process in which the ambient temperature of the quartz crystal resonator 100 rises and the resonance frequency at the temperature T in the process in which the ambient temperature of the quartz crystal resonator 100 falls are different from each other, which is called a hysteresis characteristic of a hysteresis.

It is conceivable that the reason that the resonance frequency of the resonator element 10 varies when the stress is applied to the resonator element 10 described above is that the stress is also applied to the resonating region 11c where high vibrational energy converges in the state in which the resonator element 10 is resonating, and thus, the distribution of the vibrational energy in the resonating region 11c varies. Further, it is conceivable that compared to the case in which the stress is applied to a part of the resonating region 11c, in the case in which the stress is applied to the entire resonating region 11c, namely as an area to which the stress is applied in the resonating region 11c increases, the distribution of the vibrational energy in the resonating region 11c is affected, and therefore, the variation of the resonance frequency of the resonator element 10 increases. According to the fact described above, it is conceivable that if the transmission of the stress, which occurs due to the difference between the amount of expansion or contraction of the resonator element 10 and the amount of expansion or contraction of the bottom plate 21 due to the change in ambient temperature of the quartz crystal resonator 100, to the resonating region 11c is reduced, the variation of the resonance frequency of the resonator element 10 can be reduced.

Therefore, the inventors of the invention have studied the relationship between the resonating region 11c, the first bonding member 41 and the second bonding member 42, and the stress distribution in the resonator element 10.

Figure 3A:
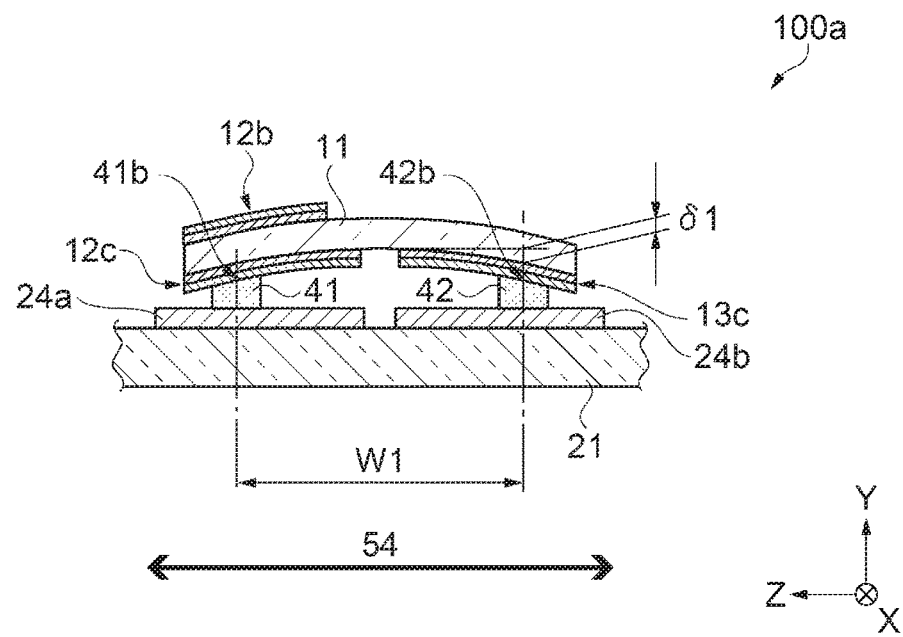
FIG. 3A is a diagram for explaining the deflection of the resonator element according to the first embodiment, and is a cross-sectional view along a first imaginary straight line assuming L1=W1 in FIG. 1A.
Figure 3B:
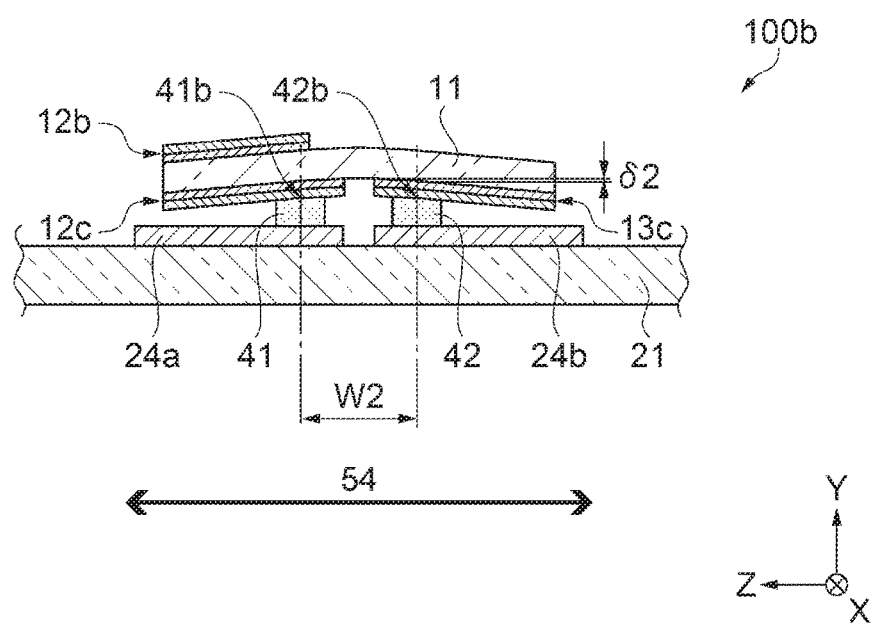
FIG. 3B is a diagram for explaining the deflection of the resonator element according to the first embodiment, and is a cross-sectional view along the first imaginary straight line assuming L1=W2 in FIG. 1A.

FIG. 3A, FIG. 3B, FIG. 4A, and FIG. 4B are diagrams for explaining the stress applied to the resonator element 10 when the predetermined temperature T has been reached in the process in which the ambient temperature of the quartz crystal resonator rises or falls. FIG. 3A is a diagram showing a deflection of the resonator element 10 viewed from the cross-sectional direction in the first imaginary straight line 51 in the case in which the predetermined temperature T has been reached in the process in which the ambient temperature of the quartz crystal resonator 100a falls in the quartz crystal resonator 100a satisfying L1 (shown in FIG. 1A)=W1. FIG. 3B is a diagram showing a deflection of the resonator element 10 viewed from the cross-sectional direction in the first imaginary straight line 51 in the case in which the predetermined temperature T has been reached in the process in which the ambient temperature of the quartz crystal resonator 100b falls in the quartz crystal resonator 100b satisfying L1 (shown in FIG. 1A)=W2. It should be noted that it is assumed that W1 and W2 satisfy W1>W2. Further, the quartz crystal resonator 100a and the quartz crystal resonator 100b are the same in the distance L2 from the intersection point 53 to the resonating region center 11d.

Figure 4A:
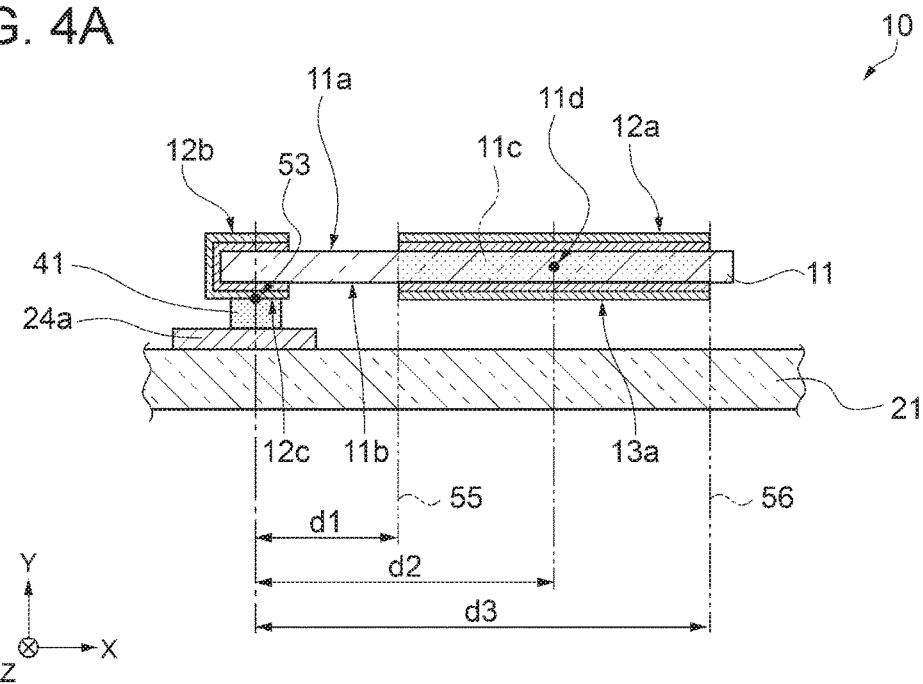
FIG. 4A is a diagram for explaining the stress applied to the resonator element according to the first embodiment, and is a cross-sectional view along a second imaginary straight line in FIG. 1A.
Figure 4B:
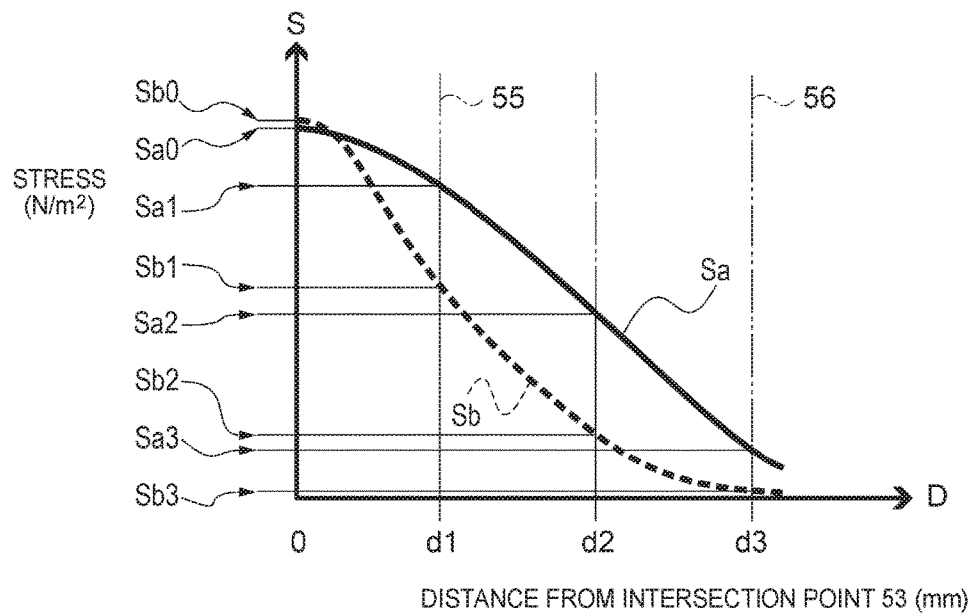
FIG. 4B is a diagram for explaining the stress applied to the resonator element according to the first embodiment, and is a schematic diagram of a stress distribution assuming L1=W1 or L1=W2.

FIG. 4A is a cross-sectional view along the second imaginary straight line 52 shown in FIG. 1A. FIG. 4B is a schematic diagram showing the stress distribution in the resonator element 10 in the direction in which the second imaginary straight line 52 extends when the ambient temperature has reached the predetermined temperature T in the quartz crystal resonator 100a shown in FIG. 3A and the quartz crystal resonator 100b shown in FIG. 3B, and shows the stress distribution in the resonator element 10 in the quartz crystal resonator 100a is represented by Sa, the stress distribution in the resonator element 10 in the quartz crystal resonator 100b is represented by Sb. Further, in FIG. 4B, the vertical axis represents the absolute value of the stress S [N/m$^2$], and the horizontal axis represents the distance D [mm] from the intersection point 53. It should be noted that in FIG. 4A and FIG. 4B, the distance from the intersection point 53 to the end 55 of the resonating region 11c located on the first imaginary straight line 51 side with respect to the resonating region center 11d is defined as d1, the distance from the intersection point 53 to the resonating region center 11d is defined as d2, and the distance from the intersection point 53 to the end 56 of the resonating region 11c located on the opposite side of the first imaginary straight line 51 with respect to the resonating region center 11d is defined as d3.

It should be noted that for the sake of convenience of explanation, illustration of the sidewall 22, the sealing ring 23, and the external connection terminals 25 is omitted in FIG. 3A, FIG. 3B, and FIG. 4A. Further, the quartz crystal resonators 100a, 100b are the same in the layout of the excitation electrodes 12a, 13a in the resonator element 10.

As in the explanation of the hysteresis described above, when the ambient temperature of the quartz crystal resonator 100a, 100b changes, a temperature difference occurs between the resonator element 10 and the bottom plate 21 due to the difference in heat propagation process. As an example, when the ambient temperature has reached the predetermined temperature T in the process in which the ambient temperature of the quartz crystal resonators 100a, 100b falls, even when the temperature of the bottom plate 21 has reached the predetermined temperature T, the temperature of the resonator element 10 is in a state higher than the predetermined temperature T. Therefore, in the case in which, for example, the resonator element 10 and the bottom plate 21 have positive thermal expansion coefficients the same in value, since the temperature of the resonator element 10 becomes higher than the temperature of the bottom plate 21 at the predetermined temperature T, the expansion amount of the resonator element 10 becomes larger than the expansion amount of the bottom plate 21, and thus, the resonator element 10 deflects in the thickness direction.

FIG. 3A and FIG. 3B respectively show the deflections of the resonator element 10 when the predetermined temperature T has been reached in the process in which the ambient temperature of the quartz crystal resonators 100a, 100b falls. According to the drawings, regarding the deflection occurring in the resonator element 10, the deflection δ2 in the quartz crystal resonator 100b satisfying L1=W2 shown in FIG. 3B is smaller than the deflection δ1 in the quartz crystal resonator 100a satisfying L1=W1 shown in FIG. 3A. This is because the distance L1 from the first bonding center 41b to the second bonding center 42b, which is an interval between the bonding members supporting the resonator element 10, in the quartz crystal resonator 100b, namely the distance W2, is shorter than the distance L1 in the quartz crystal resonator 100a, namely the distance W1, and therefore, the absolute value of the difference between the amount of expansion or contraction of the resonator element 10 and the amount of expansion or contraction of the bottom plate 21 becomes smaller.

FIG. 4B is schematic diagram showing the distribution of the stress occurring in the resonator element 10 due to the deflections shown in FIG. 3A and FIG. 3B in the direction, in which the second imaginary straight line 52 extends, of the cross-sectional part in FIG. 4A. According to FIG. 4B, the distributions Sa, Sb of the stress in the resonator element 10 both take the maximum values of Sa0, Sb0 at D=0, respectively. Further, in both of Sa, Sb, the stress decreases as the distance D from the intersection point 53 increases.

Further, in the distributions of the stress in the resonator element 10, Sb decreases more quickly than Sa as the distance D from the intersection point 53 increases. Further, in FIG. 4B, Sb is smaller than Sa at all of the parts of D=d1, D=d2, and D=d3. In other words, the stress distributed in the resonating region 11c of the quartz crystal resonator 100b satisfying L1=W2 becomes smaller than the stress distributed in the resonating region 11c of the quartz crystal resonator 100a satisfying L1=W1.

As described above, the stress distribution in the resonator element 10 varies in accordance with the distance L1 from the first bonding center 41b to the second bonding center 42b, and the stress applied to the inside of the resonating region 11c can be reduced in the case in which the distance L1 is short compared to the casein which the distance L1 is long.

However, only by regulating the length of the distance L1, the stress applied to the inside of the resonating region 11c cannot be reduced in some cases. This is because the distance L2 from the resonating region center 11d to the intersection point 53 can be set to an arbitrary value within the range in which the excitation electrode 13a, and the first bonding member 41 and the second bonding member 42 do not have direct contact with each other, and therefore, the resonating region 11c is disposed in an area, to which high stress is applied, in some cases. It should be noted that it is also possible to make the distance L2 in, for example, the quartz crystal resonator 100b shorter within the range in which the excitation electrode 13a does not have direct contact with the first bonding member 41 and the second bonding member 42, but the stress distributed in the resonating region 11c becomes high compared to the case in which the distance L2 is long. It should be noted that the same can be applied to the quartz crystal resonator element 100a.

Taking the above into consideration, it is conceivable that the stress distribution in the resonating region 11c is not related to the absolute value of each of the distance L1 from the first bonding center 41b to the second bonding center 42b and the distance L2 from the resonating region center 11d to the intersecting point 53, but is related to the ratio between the distances L1, L2.

As described above, it is conceivable that the quartz crystal resonator 100 having the resonator element 10 has the hysteresis corresponding to the stress applied to the resonator element 10, and it is conceivable that the positional relationship between the first bonding member 41 and the second bonding member 42, and the resonating region 11c is important in order to reduce the hysteresis of the quartz crystal resonator 100. Therefore, the inventors of the invention have conducted an experiment based on the thought that the hysteresis of the quartz crystal resonator 100 is related to the ratio L1/L2 between the distance L1 from the first bonding center 41b to the second bonding center 42b and the distance L2 from the resonating region center 11d to the intersection point 53, and have obtained the result shown in FIG. 4A and FIG. 4B.

The resonator element 10 used in the experiment has a rectangular shape in which the short sides in the first direction 54 shown in FIG. 1A are each 1.25 mm (corresponding to the length dimension L3 of the first side 11e) and the long sides in a direction crossing the first direction 54 are each 1.80 mm (corresponding to the length dimension L4 of the second side 11f). The excitation electrodes 12a, 13a each have a rectangular shape, and are disposed so as to roughly overlap each other viewed from above, and the short sides are disposed in the direction along the short sides of the resonator element 10, and the long sides are disposed in the direction along the long sides of the resonator element 10.

The excitation electrodes 12a, 13a each have a rectangular shape having the short sides of 0.90 mm and the long sides of 1.08 mm.

The center of the resonator element 10 and the centers of the excitation electrodes 12a, 13a roughly overlap the second imaginary straight line 52. Since the centers of the excitation electrodes 12a, 13a roughly overlap each other viewed from above, the resonating region 11c has roughly the same size, and is located at roughly the same position as those of the excitation electrodes 12a, 13a.

The first bonding center 41b and the second bonding center 42b are arranged in a direction along the first side 11e, and the distance from the first bonding center 41b to the first side 11e and the second bonding center 42b to the first side 11e are each 0.175 mm viewed from above.

Further, the resonator element 10, the excitation electrodes 12a, 13a, and the resonating region 11c are roughly symmetrically arranged about the second imaginary straight line 52 viewed from above, and the distance from the resonating region center 11d to the intersection point 53 is 0.825 mm. Further, in the experiment of the present embodiment, the upper surface 41a of the first bonding member 41 and the upper surface 42a of the second bonding member 42 are formed as a circle centered on the first bonding center 41b and having a diameter of 0.35 mm and a circle centered on the second bonding center 41b and having a diameter of 0.35 mm, respectively. Further, in the present experiment, the ratio L1/L2 is varied by varying the distance L1 from the first bonding center 41b to the second bonding center 42b while keeping the distance L2 from the resonating region center 11d to the intersection point 53 roughly constant.

Figure 5:
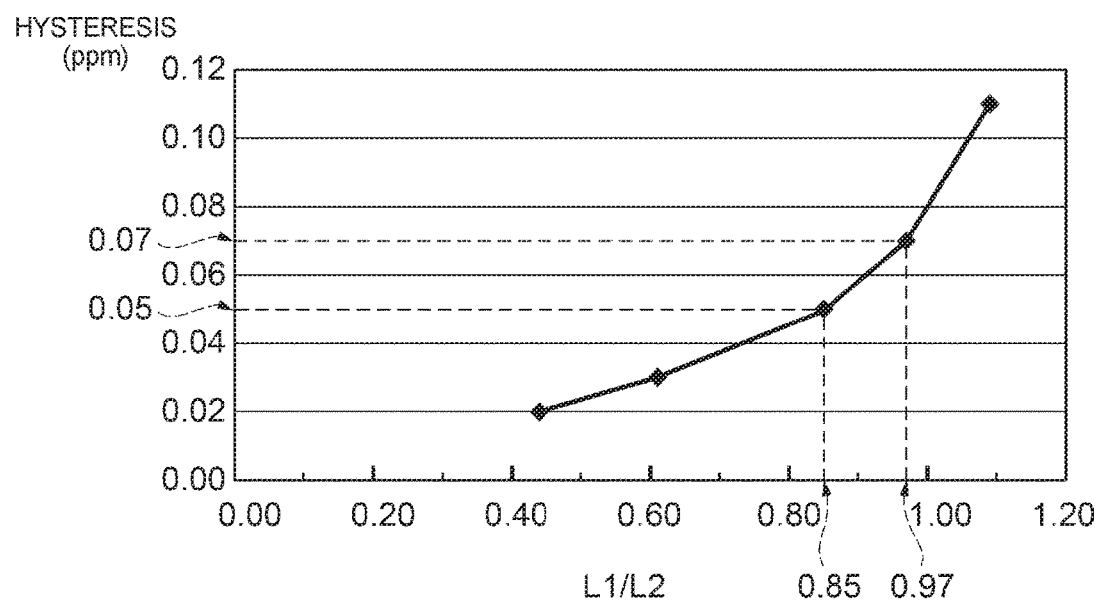
FIG. 5 is a graph showing a relationship between a ratio L1/L2 and the hysteresis of the frequency-temperature characteristic of the quartz crystal resonator.

FIG. 5 is a diagram showing a relationship between the ratio L1/L2 and the hysteresis of the quartz crystal resonator 100. Here, the resonance frequency of the quartz crystal resonator 100 at each temperature when the temperature falls and the resonance frequency of the quartz crystal resonator 100 at each temperature when the temperature rises are measured, then an absolute value of a difference between the resonance frequency when the temperature falls and the resonance frequency when the temperature rises at each temperature is obtained, and the hysteresis is defined as the maximum value of the absolute values as described later.

Further, the hysteresis of the quartz crystal resonator 100 in FIG. 5 is measured and then calculated in such a manner as described below. In the present experiment, the measurement and the calculation of the hysteresis have been performed with respect to five types of the quartz crystal resonators 100 respectively having the ratio L1/L2 of 0.36, 0.50, 0.70, 0.80, and 0.90. In the measurement and the calculation of the hysteresis of the quartz crystal resonator 100 in the present experiment, the method described below has been used.

Firstly, the ambient temperature of the quartz crystal resonators 100 is raised from the room temperature (+25° C.) to +85° C. by heating. Then, the resonance frequency of each of the quartz crystal resonators 100 when the temperature falls is measured at temperature intervals of 5° C. while decreasing the ambient temperature of the quartz crystal resonator 100 from +85° C. to −40° C. Then, the resonance frequency of each of the quartz crystal resonators 100 when the temperature rises is measured at the temperatures, at which the resonance frequency has been measured when the temperature falls, while raising the ambient temperature of the quartz crystal resonators 100 from −40° C. to +85° C. Then a differential frequency as the difference between the resonance frequency when the temperature falls and the resonance frequency when the temperature rises is obtained with respect to the resonance frequencies of each of the quartz crystal resonators 100 in the same temperature condition measured when the temperature falls and when the temperature rises, respectively. Then, the normalized frequency at each of the temperature conditions is obtained by normalizing the differential frequency at the temperature condition with the nominal frequency (resonance frequency at the room temperature (+25° C.)) of the quartz crystal resonator 100. Lastly, a value with the maximum absolute value out of the normalized frequencies in the respective temperature conditions, and the value is extracted as the hysteresis of the quartz crystal resonator 100. The measurement described above is performed on the five types of the quartz crystal resonators 100 with the respective ratios L1/L2 used in the present experiment to calculate the hysteresis of each of the quartz crystal resonators 100 with the respective ratios L1/L2.

According to FIG. 5, in the case in which the ratio L1/L2, which is the ratio between the distance L1 from the first bonding center 41b to the second bonding center 42b and the distance L2 from the resonating region center 11d to the intersection point 53, is 0.97, the hysteresis of the quartz crystal resonator 100 is 0.07 ppm. Further, FIG. 5 shows the fact that by extrapolating the hysteresis of the quartz crystal resonator 100 from the value of the ratio L1/L2 smaller than 0.36, the hysteresis becomes smaller. Therefore, in the range of 0<L1/L2≤0.97, it is satisfied that the hysteresis of the quartz crystal resonator 100 is equal to or smaller than 0.07 ppm. Further, in the case of the ratio L1/L2=0.85, the hysteresis of the quartz crystal resonator 100 is 0.05 ppm. Therefore, in the range of 0<L1/L2≤0.85, the hysteresis of the quartz crystal resonator 100 is equal to or smaller than 0.05 ppm.

In the case in which the quartz crystal resonator 100 or an oscillator or the like using the quartz crystal resonator 100 is used for a product such as an electronic apparatus as a reference frequency source, the hysteresis of the quartz crystal resonator 100 is required to be small in absolute value in order to prevent the performance of the electronic apparatus from degrading. In particular, in the case in which the quartz crystal resonator 100 or the oscillator or the like using the quartz crystal resonator 100 is used as the reference frequency source of, for example, a femtocell base station device for cellular phones, the variation of the frequency-temperature characteristic of the quartz crystal resonator 100 or the oscillator or the like using the quartz crystal resonator 100 is required to be equal to or smaller than 0.25 ppm, and in order to satisfy the value, the hysteresis is required to be equal to or smaller than 0.1 ppm. Therefore, it is preferable for the hysteresis of the quartz crystal resonator 100 or the oscillator or the like using the quartz crystal resonator 100 to be equal to or smaller than 0.07 ppm.

Further, in the case in which the quartz crystal resonator 100 or the oscillator or the like using the quartz crystal resonator 100 is used for an electronic apparatus required to have a higher frequency accuracy such as a device for achieving synchronization with a GPS signal, a macrocell base station device for cellular phones, or an optical network (backbone network) base station device, it is preferable for the hysteresis of the quartz crystal resonator 100 or the oscillator or the like using the quartz crystal resonator 100 to be equal to or smaller than 0.05 ppm.

As described hereinabove, it is possible for the quartz crystal resonator 100 satisfying the relationship of 0<L1/L2≤0.97, $|(\alpha 2-\alpha 1)/\alpha 1|\leq 0.35$, $|(\alpha 3-\alpha 1)/\alpha 1|\leq 0.35$, and L3≤1.5 mm to obtain the following advantages.

The excitation electrodes 12a, 13a, the extraction electrodes 12b, 13b and the connection electrodes 12c, 13c connected respectively to the excitation electrodes 12a, 13a are each formed of the two layers, namely the first metal layer 121 and the second metal layer 122 to achieve the configuration in which the difference between the linear expansion coefficients $\alpha 1$, $\alpha 2$ of the first metal layer 121 and the second metal layer 122, and the linear expansion coefficient $\alpha 3$ of the quartz crystal substrate 11 is small. Therefore, even in the case in which, for example, the ambient temperature of the quartz crystal resonator 100 varies, it is possible to reduce the stress generated between the first metal layer 121 and the quartz crystal substrate 11, and the stress generated between the first metal layer 121 and the second metal layer 122, and thus, it is possible to reduce the stress transmitted to the resonating region 11c of the quartz crystal substrate 11. Thus, it becomes hard to be affected by the change in stress in the case in which the ambient temperature of the quartz crystal resonator 100 has changed, and it is possible to reduce the variation of the characteristics of the quartz crystal resonator 100 such as the variation of the frequency-temperature characteristic or the hysteresis.

Further, even in the case in which, for example, the stress has occurred in the quartz crystal resonator 100 due to the difference between the amount of expansion or contraction of the resonator element 10 and the amount of expansion or contraction of the bottom plate 21 due to the change in ambient temperature of the quartz crystal resonator 100, since the ratio L1/L2 satisfies the relationship of 0<L1/L2≤0.97, it is possible to reduce the stress transmitted to the resonating region 11c of the resonator element 10. As a result, it is possible to reduce the characteristic variation such as the level of the hysteresis of the quartz crystal resonator 100.

Further, even in the case in which, for example, the stress has occurred in the quartz crystal resonator 100 due to the difference between the amount of expansion or contraction of the resonator element 10 and the amount of expansion or contraction of the bottom plate 21 due to the change in ambient temperature of the quartz crystal resonator 100, since the ratio L1/L2 satisfies the relationship of 0<L1/L2≤0.85, it is possible to further reduce the stress transmitted to the resonating region 11c of the resonator element 10. As a result, it is possible to further reduce the characteristic variation such as the level of the hysteresis of the quartz crystal resonator 100 compared to the case of 0<L1/L2≤0.97.

It should be noted that since in the present experiment, the diameter of the upper surface 41a of the first bonding member 41 and the upper surface 42a of the second bonding member 42 is 0.35 mm, it is preferable for the lower limit value of the distance L1 to be longer than 0.35 mm as the range in which the first bonding member 41 and the second bonding member 42 are not electrically connected to each other. In other words, it is preferable for the ratio L1/L2 to satisfy the relationship of 0.425<L1/L2≤0.97.

Further, in the case of forming the first bonding member 41 and the second bonding member 42 with an electrically-conductive adhesive, the upper surface 41a of the first bonding member 41 and the upper surface 42a of the second bonding member 42 can be formed so as to have a diameter equal to or smaller than 0.15 mm, and therefore, it is preferable for the lower limit value of the distance L1 to be larger than 0.15 mm as the range in which the first bonding member 41 and the second bonding member 42 is not electrically connected to each other. In other words, it is preferable for the ratio L1/L2 to satisfy the relationship of 0.185<L1/L2≤0.97.

Further, although in the present experiment, the measurement of the resonance frequency when making the ambient temperature of the quartz crystal resonator 100 fall is performed first, it is not a limitation, and the measurement of the resonance frequency when making the ambient temperature of the quartz crystal resonator 100 rise can be performed first. Further, the temperature interval for the measurement is not limited to 5° C. as set in the experiment described above, but is only required to be a temperature interval with which the hysteresis can be calculated, and can also be a temperature interval within a range of, for example, no lower than 0.5° C. and no higher than 10° C. Further, although in the experiment described above, the room temperature is assumed as +25° C., it is not a limitation, and the room temperature can also be assumed as a range no lower than 0° C. and no higher than +40° C.

Further, although in the present embodiment, the quartz crystal substrate 11 is used in the resonator element 10, the resonator element 10 can also be formed of other piezoelectric single crystal such as a lithium tantalate or a lithium niobate. In the case in which the resonator element 10 is formed of the piezoelectric single crystal other than the quartz crystal, the orientation (cut angle) of the crystal and so on are selected so that equivalent characteristics to the case in which the resonator element 10 is formed of the quartz crystal can be obtained. As the resonator element 10, there can also be used an surface acoustic wave element, an MEMS resonator element, and so on besides the piezoelectric resonator element. Further, the resonator element 10 can also be formed of a piezoelectric material such as a piezoelectric ceramic such as lead zirconate titanate, a silicon substrate, or the like besides the piezoelectric single crystal. Further, the shape of the resonator element 10 is not particularly limited, but can also be a shape such as a two-legged tuning fork, an H-type tuning fork, a three-legged tuning fork, a comb-tooth type, an orthogonal type, or a prismatic type. As an excitation device of the resonator element 10, there can be used a device using a piezoelectric effect, or electrostatic drive using a coulomb force. In addition, the resonator element 10 can be an element for detecting a physical quantity such as an element for an inertia sensor (e.g., an acceleration sensor, or a gyro sensor), or a force sensor (e.g., a tilt sensor).

Further, regarding the resonator element 10 and the excitation electrodes 12a, 13a, a variety of shapes and sizes can be adopted besides the shapes and the sizes used in the present experiment. Further, regarding the upper surface 41a of the first bonding member 41 and the upper surface 42a of the second bonding member 42, a variety of shapes and sizes can be adopted besides the shape and the size used in the present experiment.

Further, although in the present embodiment, members having electrical conductivity are used as the first bonding member 41 and the second bonding member 42, this is not a limitation, and it is also possible for at least either one of the first bonding member 41 and the second bonding member 42 to be formed of a member not provided with electrical conductivity such as resin or glass not containing an electrically-conductive member. In the case in which the first bonding member 41 and the second bonding member 42 are formed of the member not provided with electrical conductivity, the resonator element 10 is mechanically supported by the bottom plate 21 via the first bonding member 41 and the second bonding member 42, and the excitation electrode 12a and the internal connection terminal 24a, and the excitation electrode 13a and the internal connection terminal 24b can electrically be connected to each other via electrically-conductive members such as bonding wires, respectively. Further, even in the case in which one of the first bonding member 41 and the second bonding member 42 has electrical conductivity, and the other does not have electrical conductivity, it is also possible that the mechanical connection and the electrical connection are achieved using substantially the same method as described above in the bonding member not provided with the electrical conductivity, and the mechanical connection and the electrical connection substantially the same as in the first embodiment in the bonding member having the electrical conductivity.

As described above, even in the case of using the member not provided with electrical conductivity as at least one of the first bonding member 41 and the second bonding member 42, at least a part of the advantage of the first embodiment can be obtained. This is because, even in the case in which the member not provided with electrical conductivity is used for at least one of the first bonding member 41 and the second bonding member 42, the resonator element 10 is mechanically connected to the bottom plate 21 via the first bonding member 41 and the second bonding member 42. Therefore, if the resonating region 11c, the first bonding member 41, and the second bonding member 42 satisfy the relationship of 0<L1/L2≤0.97, it is possible to reduce the transmission of the stress having occurred due to the difference between the amount of expansion or contraction of the resonator element 10 and the amount of expansion or contraction of the bottom plate 21 due to the change in ambient temperature of the quartz crystal resonator 100 to the resonating region 11c. As a result, the characteristic variation such as the level of the hysteresis of the quartz crystal resonator 100 can be reduced.

Further, although in the present embodiment, the explanation is presented illustrating the quartz crystal resonator 100 having the resonator element 10 as an example of the resonator device, this is not a limitation, and the invention can be applied to a variety of types of resonator devices. As an example of the resonator device, it is also possible to adopt a sensor such as an inertia sensor (e.g., an acceleration sensor, or a gyro sensor) or a force sensor (e.g., a tilt sensor) having an element for detecting a physical quantity, and a detection circuit for detecting a signal from the element, or an oscillation circuit for oscillating the element. It is also possible for the oscillation circuit and the detection circuit described above to be arranged, for example, on the internal space 26 side of the bottom plate 21, or on the side of the bottom plate 21 on which the plurality of external terminals 25 is formed. Further, it is also possible for the oscillation circuit and the detection circuit described above to be arranged separated from the resonator device, and electrically connected to the resonator element 10 via the plurality of external connection terminals 25 of the resonator device.

Second Embodiment

A quartz crystal resonator 200 will be described as an example of a resonator device according to a second embodiment. It should be noted that the constituents identical to those of the quartz crystal resonator 100 according to the first embodiment described above are denoted by the same reference symbols, and the explanation thereof will be omitted, while the parts different from those of the quartz crystal resonator 100 according to the first embodiment described above will mainly be described.

Figure 6A:
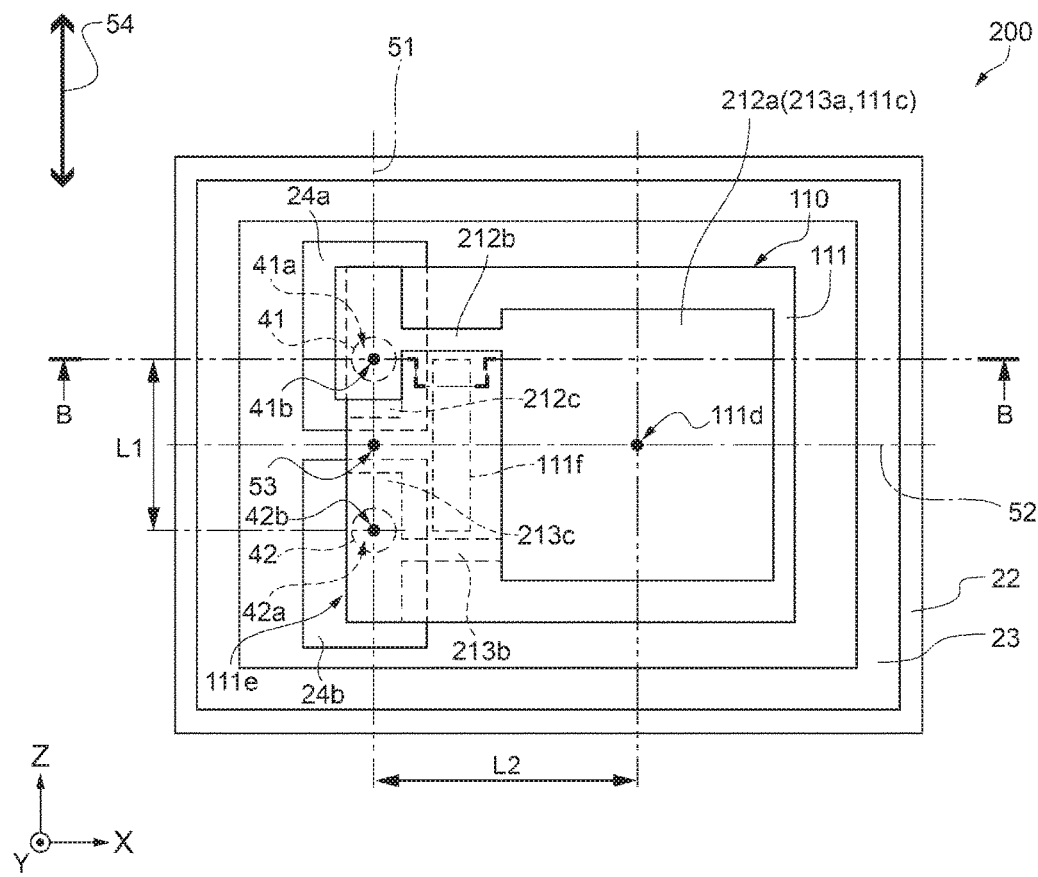
FIG. 6A is a plan view showing a schematic configuration of a quartz crystal resonator as a resonator device according to a second embodiment of the invention.
Figure 6B:
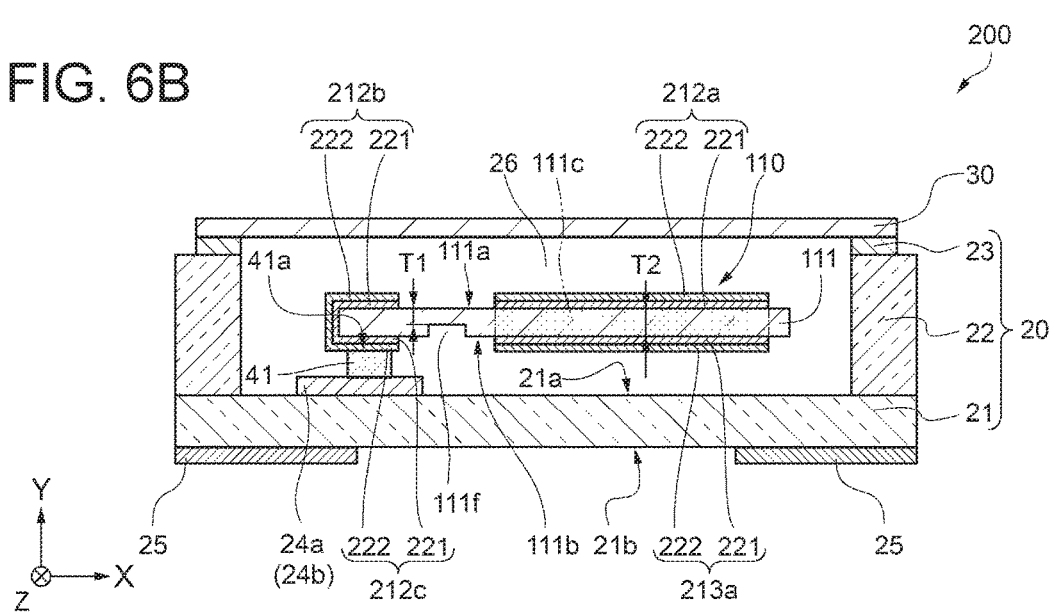
FIG. 6B is a cross-sectional view along the line B-B in FIG. 6A.

FIG. 6A and FIG. 6B are schematic diagrams of the quartz crystal resonator 200 as the resonator device according to the second embodiment, wherein FIG. 6A is a plan view, and FIG. 6B is a cross-sectional view along the line B-B shown in FIG. 6A.

As shown in FIG. 6A and FIG. 6B, the quartz crystal resonator 200 is constituted by a resonator element 110, the package 20, the first bonding member 41, the second bonding member 42, the lid 30 as the lid member, and so on. It should be noted that in FIG. 6A, the lid 30 is omitted from the drawing for the sake of convenience of explanation.
Resonator Element The resonator element 110 includes a quartz crystal substrate 111 as a base member formed of quartz crystal as a type of piezoelectric single crystal, a pair of excitation electrodes 212a, 213a, extraction electrodes 212b, 213b, and connection electrodes 212c, 213c. A predetermined alternating-current voltage is applied to the excitation electrodes 212a, 213a, and thus, the resonator element 110 vibrates with a predetermined resonance frequency.

Similarly to the first embodiment, the excitation electrodes 212a, 213a, the extraction electrodes 212b, 213b, and the connection electrodes 212c, 213c are each formed of at least two layers including a foundation layer (a first metal layer 221) and an upper layer (a second metal layer 222). The first metal layer 221 as the foundation layer is disposed on the quartz crystal substrate 111, namely on the quartz crystal substrate 111 side, and the second metal layer 222 as the upper layer is disposed on the first metal layer 221, namely on the opposite side to the quartz crystal substrate 111 side.

As the constituent materials of the first metal layer 221 and the second metal layer 222, there are used materials satisfying $|(\alpha2-\alpha1)/\alpha1|\leq0.35$ and $|(\alpha3-\alpha1)/\alpha1|\leq0.35$ defining the linear expansion coefficient of the first metal layer 221 as $\alpha1$, the linear expansion coefficient of the second metal layer 222 as $\alpha2$, and the linear expansion coefficient of the quartz crystal substrate 111, which is a base member, as $\alpha3$. By adopting such an electrode configuration, similarly to the first embodiment, even in the case in which, for example, the ambient temperature of the quartz crystal resonator 200 varies, it is possible to reduce the stress generated between the first metal layer 221 and the quartz crystal substrate 111, and the stress generated between the first metal layer 221 and the second metal layer 222.

As shown in FIG. 6A and FIG. 6B, in the quartz crystal resonator 200, the resonator element 110 is different from that in the first embodiment, and is provided with a recess 111f formed between the first imaginary straight line 51 connecting the first bonding center 41b and the second bonding center 42b to each other and the excitation electrode 213a of the lower surface 111b viewed from above, and on the lower surface 111b side of the quartz crystal substrate 111. Further, the recess 111f is disposed so as to extend from the first bonding center 41b to the second bonding center 42b in the direction along the first direction 54.

The length of a part corresponding to the recess 111f in the direction crossing the upper surface 111a and the lower surface 111b of the quartz crystal substrate 111, namely the thickness T1 of the recess 111f, is made thinner than the thickness T2 of a part of the quartz crystal substrate 111 not provided with the recess 111f. Further, the recess 111f is formed inside the ends in the first direction 54 of the quartz crystal substrate 111 viewed from above.

In the quartz crystal resonator 200 according to the present embodiment, the stress occurring due to the difference between the amount of expansion or contraction of the quartz crystal resonator 200 and the amount of expansion or contraction of the resonator element 110 and the bottom plate 21 due to the change in ambient temperature is transmitted to the resonating region 111c of the resonator element 110, namely the region overlapping the excitation electrodes 212a, 213a in the quartz crystal substrate 111 shown in FIG. 6A, and the region with the net-like hatching in the quartz crystal substrate 111 shown in FIG. 6B via a region provided with the recess 111f. The thickness T1 of the recess 111f of the quartz crystal substrate 111 is thinner than the thickness T2 of the quartz crystal substrate 111. In the case in which the stress is transmitted to the region with the thickness T2 via the region with the thickness T1, since the region with the thickness T1 is more largely deflected to absorb the stress compared to the region with the thickness T2, the stress transmitted to the region with the thickness T2 is reduced. Therefore, the stress occurring due to the difference between the amount of expansion or contraction of the resonator element 110 and the amount of expansion or contraction of the bottom plate 21 as the substrate due to the change in ambient temperature of the quartz crystal resonator 200 is made hard to be transmitted to the resonating region 111c by deflecting the recess 111f.

As described hereinabove, according to the quartz crystal resonator 200 related to the present embodiment, since the resonating region 111c, the first bonding member 41, and the second bonding member 42 satisfy the relationship of 0<L1/L2≤0.97, the following advantage can be obtained in addition to the advantage in the quartz crystal resonator 100 according to the first embodiment. In the quartz crystal resonator 200 according to the present embodiment, the stress, which occurs due to the difference between the amount of expansion or contraction of the resonator element 110 and the amount of expansion or contraction of the bottom plate 21 due to the change in ambient temperature, and is then transmitted to the resonating region 111c, is further reduced compared to the first embodiment. Therefore, it is possible to further reduce the characteristic variation such as the level of the hysteresis of the quartz crystal resonator 200 compared to the first embodiment.

It should be noted that the position where the recess 111f is formed is not limited to the position in the present embodiment. It is also possible for the recess 111f to be formed separately at two or more places, for example, a place between the first bonding center 41b and the excitation electrodes 212a, 213a and a place between the second bonding center 42b and the excitation electrodes 212a, 213a viewed from above. Further, it is also possible for the recess 111f to be formed at two or more places in a direction crossing the first direction 54 providing the places are located between the first imaginary straight line 51 and the excitation electrodes 212a, 213a.

Third Embodiment

A quartz crystal resonator 300 will be described as an example of a resonator device according to a third embodiment. It should be noted that the constituents identical to those of the quartz crystal resonator 100 according to the first embodiment described above are denoted by the same reference symbols, and the explanation thereof will be omitted, while the parts different from those of the quartz crystal resonator 100 according to the first embodiment described above will mainly be described.

Figure 7A:
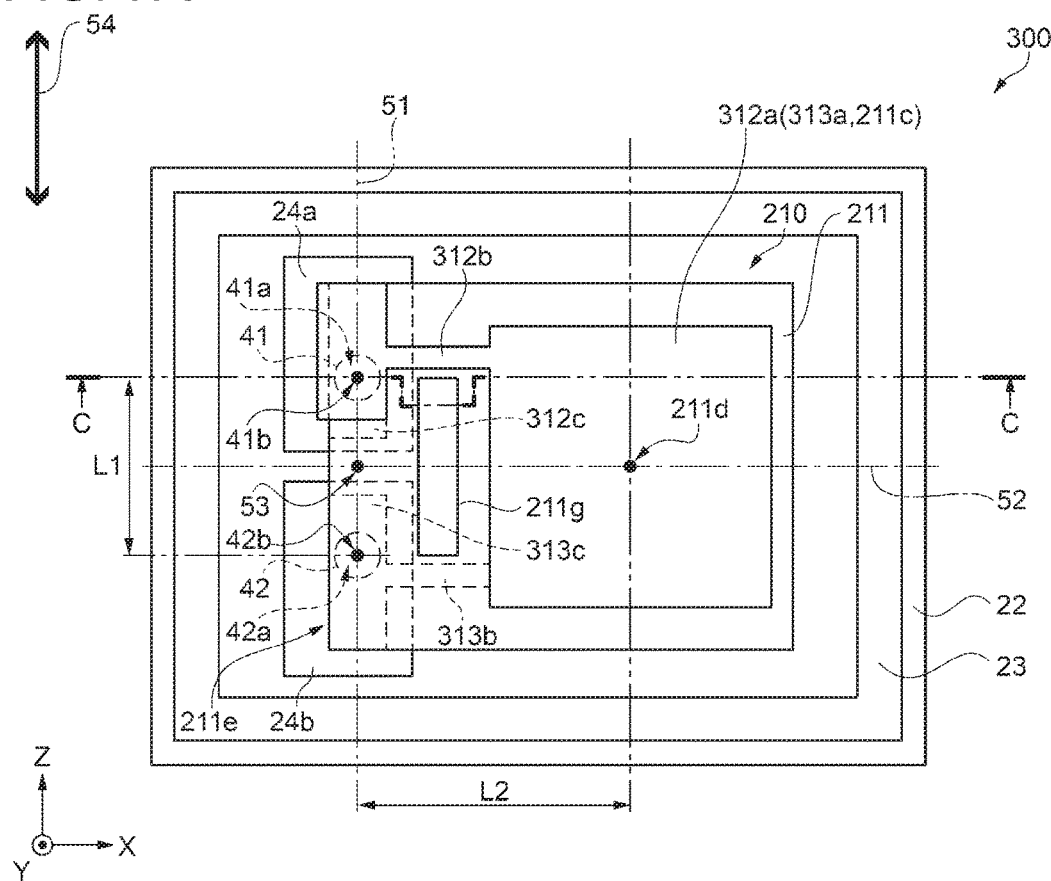
FIG. 7A is a plan view showing a schematic configuration of a quartz crystal resonator as a resonator device according to a third embodiment of the invention.
Figure 7B:
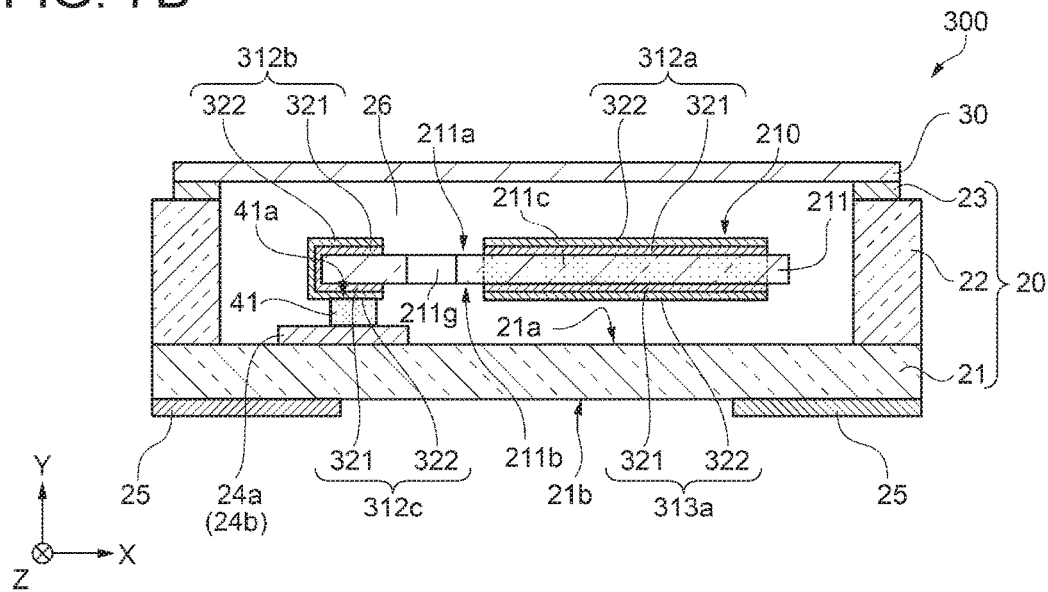
FIG. 7B is a cross-sectional view along the line C-C in FIG. 7A.

FIG. 7A and FIG. 7B are schematic diagrams of the quartz crystal resonator 300 as the resonator device according to the third embodiment, wherein FIG. 7A is a plan view, and FIG. 7B is a cross-sectional view along the line C-C shown in FIG. 7A.

As shown in FIG. 7A and FIG. 7B, the quartz crystal resonator 300 is constituted by a resonator element 210, the package 20, the first bonding member 41, the second bonding member 42, the lid 30 as the lid member, and so on. It should be noted that in FIG. 7A, the lid 30 is omitted from the drawing for the sake of convenience of explanation.
Resonator Element The resonator element 210 includes a quartz crystal substrate 211 as a base member formed of quartz crystal as a type of piezoelectric single crystal, a pair of excitation electrodes 312a, 313a, extraction electrodes 312b, 313b, and connection electrodes 312c, 313c. A predetermined alternating-current voltage is applied to the excitation electrodes 312a, 313a, and thus, the resonator element 210 vibrates with a predetermined resonance frequency.

Similarly to the first embodiment, the excitation electrodes 312a, 313a, the extraction electrodes 312b, 313b, and the connection electrodes 312c, 313c are each formed of at least two layers including a foundation layer (a first metal layer 321) and an upper layer (a second metal layer 322). The first metal layer 321 as the foundation layer is disposed on the quartz crystal substrate 211, namely on the quartz crystal substrate 211 side, and the second metal layer 322 as the upper layer is disposed on the first metal layer 321, namely on the opposite side to the quartz crystal substrate 211 side.

As the constituent materials of the first metal layer 321 and the second metal layer 322, there are used materials satisfying $|(\alpha 2-\alpha 1)/\alpha 1|\leq 0.35$ and $|(\alpha 3-\alpha 1)/\alpha 1|\leq 0.35$ defining the linear expansion coefficient of the first metal layer 321 as $\alpha 1$, the linear expansion coefficient of the second metal layer 322 as $\alpha 2$, and the linear expansion coefficient of the quartz crystal substrate 211, which is a base member, as $\alpha 3$. By adopting such an electrode configuration, similarly to the first embodiment, even in the case in which, for example, the ambient temperature of the quartz crystal resonator 300 varies, it is possible to reduce the stress generated between the first metal layer 321 and the quartz crystal substrate 211, and the stress generated between the first metal layer 321 and the second metal layer 322.

As shown in FIG. 7A and FIG. 7B, in the quartz crystal resonator 300, the resonator element 210 is different from that in the first embodiment, and is provided with a hole 211g formed between the first imaginary straight line 51 connecting the first bonding center 41b and the second bonding center 42b to each other and the excitation electrodes 312a, 313a so as to penetrate the quartz crystal substrate 211 from the upper surface 211a to the lower surface 211b. Further, the hole 211g is disposed so as to extend from the first bonding center 41b to the second bonding center 42b in the direction along the first direction 54.

In the quartz crystal resonator 300 according to the present embodiment, the stress occurring due to the difference between the amount of expansion or contraction of the resonator element 210 and the amount of expansion or contraction of the bottom plate 21 due to the change in ambient temperature is transmitted to the resonating region 211c of the resonator element 210, namely the region overlapping the excitation electrodes 312a, 313a in the quartz crystal substrate 211 shown in FIG. 7A, and the region with the net-like hatching in the quartz crystal substrate 211 shown in FIG. 7B via both of an area not adjacent to the hole 211g of the quartz crystal substrate 211 and an area adjacent to the hole 211g. The area adjacent to the hole 211g of the quartz crystal substrate 211 is easily deflected than the area not adjacent to the hole 211g. As a result, the stress occurring due to the difference between the amount of expansion or contraction of the resonator element 210 and the amount of expansion or contraction of the bottom plate 21 as the substrate due to the change in ambient temperature of the quartz crystal resonator 300 is made hard to be transmitted to the resonating region 211c by deflecting the area adjacent to the hole 211g.

As described hereinabove, according to the quartz crystal resonator 300 related to the present embodiment, since the resonating region 211c, the first bonding member 41, and the second bonding member 42 satisfy the relationship of 0<L1/L2≤0.97, the following advantage can be obtained in addition to the advantage in the quartz crystal resonator 100 according to the first embodiment. In the quartz crystal resonator 300 according to the present embodiment, the stress, which occurs due to the difference between the amount of expansion or contraction of the resonator element 210 and the amount of expansion or contraction of the bottom plate 21 due to the change in ambient temperature of the quartz crystal resonator 300, and is then transmitted to the resonating region 211c, is further reduced compared to the first embodiment. Therefore, it is possible to further reduce the characteristic variation such as the level of the hysteresis of the quartz crystal resonator 300 compared to the first embodiment.

It should be noted that the position where the hole 211g is formed is not limited to the position in the present embodiment. It is also possible for the hole 211g to be formed at two or more places, for example, a place between the first bonding center 41b and the excitation electrodes 312a, 313a and a place between the second bonding center 42b and the excitation electrodes 312a, 313a viewed from above. Further, it is also possible for the hole 211g to be formed at two or more places in a direction crossing the first direction 54 providing the places are located between the first imaginary straight line 51 and the excitation electrodes 312a, 313a.

Fourth Embodiment

A quartz crystal resonator 400 will be described as an example of a resonator device according to a fourth embodiment. It should be noted that the constituents identical to those of the quartz crystal resonator 100 according to the first embodiment described above are denoted by the same reference symbols, and the explanation thereof will be omitted, while the parts different from those of the quartz crystal resonator 100 according to the first embodiment described above will mainly be described.

Figure 8A:
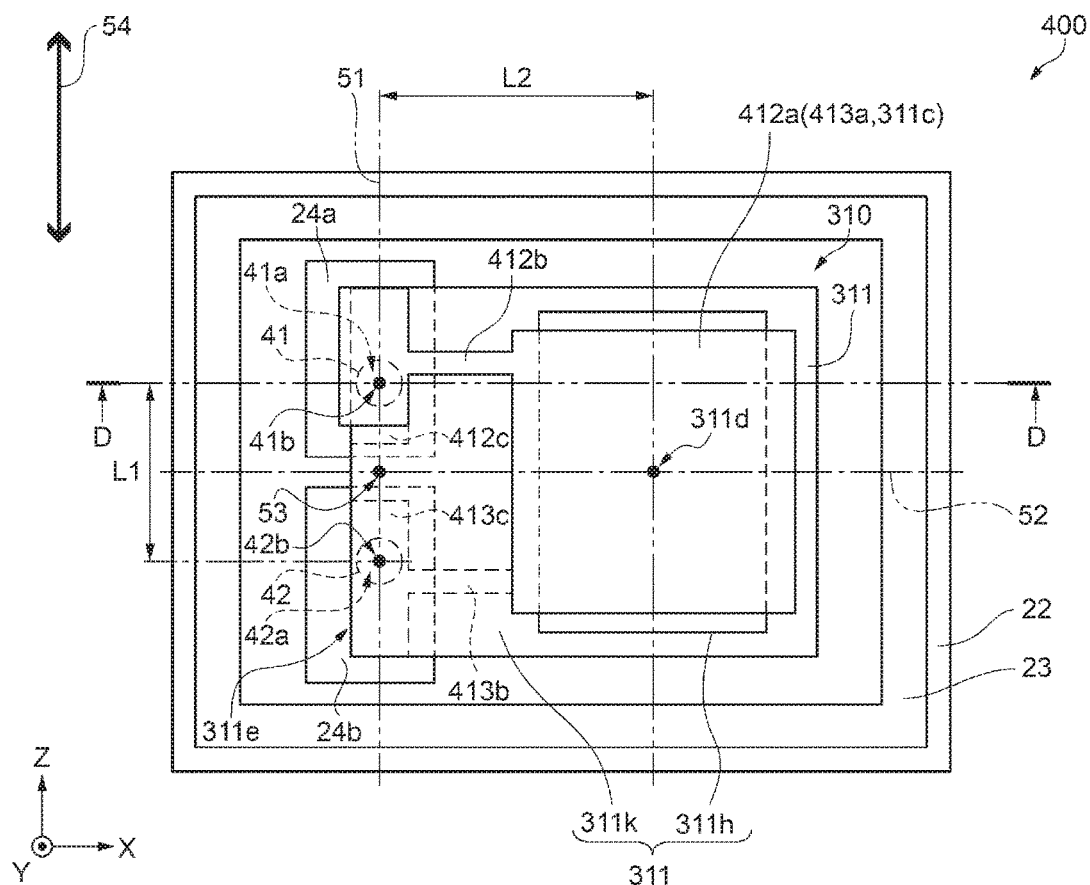
FIG. 8A is a plan view showing a schematic configuration of a quartz crystal resonator as a resonator device according to a fourth embodiment of the invention.
Figure 8B:
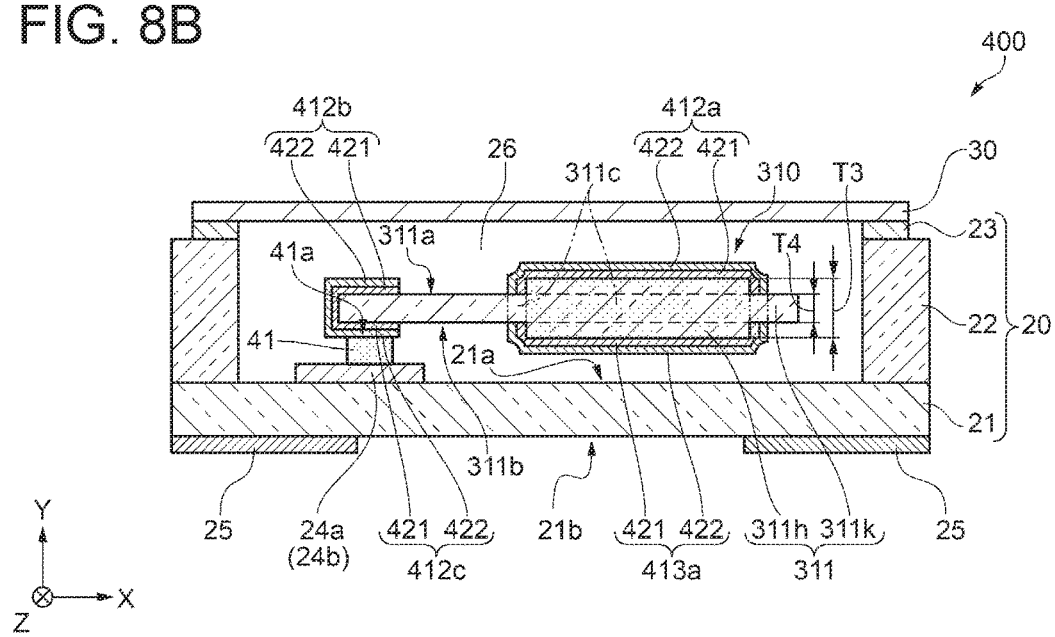
FIG. 8B is a cross-sectional view along the line D-D in FIG. 8A.
Figure 8C:
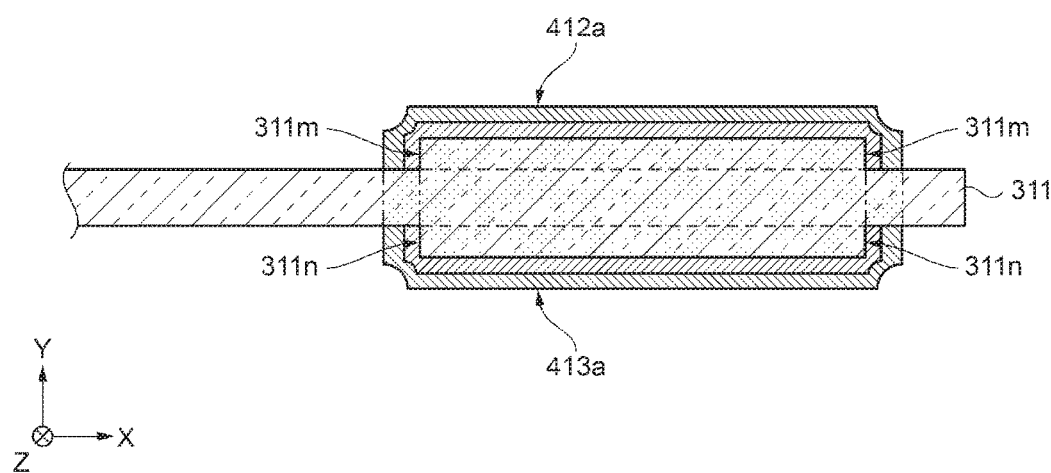
FIG. 8C is a partial cross-sectional view of an excitation electrode part of the quartz crystal resonator according to the fourth embodiment.

FIG. 8A and FIG. 8B are schematic diagrams of the quartz crystal resonator 400 as the resonator device according to the fourth embodiment, wherein FIG. 8A is a plan view, and FIG. 8B is a cross-sectional view along the line D-D shown in FIG. 8A, and FIG. 8C is a partial cross-sectional view of the excitation electrode part shown in FIG. 8B.

As shown in FIG. 8A and FIG. 8B, the quartz crystal resonator 400 is constituted by a resonator element 310, the package 20, the first bonding member 41, the second bonding member 42, the lid 30 as the lid member, and so on. It should be noted that in FIG. 8A, the lid 30 is omitted from the drawing for the sake of convenience of explanation.

Resonator Element

In the quartz crystal resonator 400 according to the present embodiment, in the resonator element 310, the length in a direction crossing an obverse surface 311a as an upper surface of the quartz crystal substrate 311 and a reverse surface 311b as a lower surface, namely the thickness of the quartz crystal substrate 311, is a first thickness T3 in a first region 311h, and a thickness T4 thinner than the first thickness T3 in a second region 311k to provide a so-called mesa structure. The quartz crystal substrate 311 has a shape in which the first region 311h is surrounded by the second region 311k viewed from above. Further, in the resonator element 310, there are provided a pair of excitation electrodes 412a, 413a, extraction electrodes 412b, 413b, and connection electrodes 412c, 413c. A predetermined alternating-current voltage is applied to the excitation electrodes 412a, 413a, and thus, the resonator element 310 vibrates with a predetermined resonance frequency.

Similarly to the first embodiment, the excitation electrodes 412a, 413a, the extraction electrodes 412b, 413b, and the connection electrodes 412c, 413c are each formed of at least two layers including a foundation layer (a first metal layer 421) and an upper layer (a second metal layer 422). The first metal layer 421 as the foundation layer is disposed on the quartz crystal substrate 311, namely on the quartz crystal substrate 311 side, and the second metal layer 422 as the upper layer is disposed on the first metal layer 421, namely on the opposite side to the quartz crystal substrate 311 side.

As the constituent materials of the first metal layer 421 and the second metal layer 422, there are used materials satisfying $|(\alpha 2-\alpha 1)/\alpha 1| \leq 0.35$ and $|(\alpha 3-\alpha 1)/\alpha 1| \leq 0.35$ defining the linear expansion coefficient of the first metal layer 421 as $\alpha 1$, the linear expansion coefficient of the second metal layer 422 as $\alpha 2$, and the linear expansion coefficient of the quartz crystal substrate 311, which is a base member, as $\alpha 3$. By adopting such an electrode configuration, similarly to the first embodiment, even in the case in which, for example, the ambient temperature of the quartz crystal resonator 400 varies, it is possible to reduce the stress generated between the first metal layer 421 and the quartz crystal substrate 311, and the stress generated between the first metal layer 421 and the second metal layer 422.

As shown in FIG. 8A, the pair of excitation electrodes 412a, 413a each have a rectangular shape, and are disposed so as to roughly overlap one another viewed from above. In other words, the pair of excitation electrodes 412a, 413a are disposed so that the center of the excitation electrode 412a and the center of the excitation electrode 413a roughly overlap one another. Further, the quartz crystal substrate 311 is provided with a resonating region 311c sandwiched by the excitation electrodes 412a, 413a, namely the region overlapping the excitation electrodes 412a, 413a in the quartz crystal substrate 311 shown in FIG. 8A, and the region with the net-like hatching in the quartz crystal substrate 311 shown in FIG. 8B. Further, the excitation electrodes 412a, 413a are arranged so as to overlap the first region 311h in the first direction 54, and overlap the first region 311h and the second region 311k in a direction crossing the first direction 54 viewed from above.

The resonating region 311c has a resonating region center 311d. Since the excitation electrodes 412a, 413a have the arrangement described above, the resonating region 311c has a rectangular shape, and the resonating region center 311d and the centers of the excitation electrodes 412a, 413a roughly overlap each other viewed from above.

The resonating region center 311d and the center of the first region 311h are arranged so as to roughly overlap each other viewed from above. Further, in the present embodiment, the first region 311h overlap a large proportion of the resonating region 311c. The large proportion of the resonating region 311c is preferably, for example, equal to or higher than 80%. It should be noted that the centers of the excitation electrodes 412a, 413a, the resonating region center 311d, and the center of the first region 311h described above are the centroids of the shapes of the excitation electrodes 412a, 413a viewed from above, the centroid of the shape of the resonating region 311c viewed from above, and the centroid of the shape of the first region 311h viewed from above, respectively.

Further, as shown in FIG. 8B and FIG. 8C, the excitation electrode 412a is arranged continuously on the upper surface of the first region 311h, a side surface 311m connecting the upper surface of the first region 311h and the upper surface of the second region 311k to each other, and the upper surface of the second region 311k in a direction crossing the first direction 54. The excitation electrode 413a is arranged continuously on the lower surface of the first region 311h, a side surface 311n connecting the lower surface of the first region 311h and the lower surface of the second region 311k to each other, and the lower surface of the second region 311k in the direction crossing the first direction 54.

In the quartz crystal resonator 400 of the present embodiment, the resonating region center 311d overlaps the first region 311h having the first thickness T3, and at the same time, the first bonding center 41b and the second bonding center 42b overlap the second region 311k having the thickness T4 thinner than the thickness T3 viewed from above. In other words, the resonator element 310 is supported by the bottom plate 21 via the first bonding member 41 and the second bonding member 42 in the second region 311k having the thickness T4 thinner than the thickness T3 of the first region 311h to which a large part of the vibration energy is converged in the state in which the resonator element 310 is resonating. Therefore, the stress occurring due to the difference between the amount of expansion or contraction of the resonator element 310 and the amount of expansion or contraction of the bottom plate 21 as the substrate due to the change in ambient temperature of the quartz crystal resonator 400 is transmitted to the resonating region 311c via the second region 311k. In the case in which the stress is transmitted to the region with the thickness T3 via the region with the thickness T4, since the region with the thickness T4 is more largely deflected to absorb the stress compared to the region with the thickness T3, the stress transmitted to the region with the thickness T3 is reduced. Therefore, the stress occurring due to the difference between the amount of expansion or contraction of the resonator element 310 and the amount of expansion or contraction of the bottom plate 21 due to the change in ambient temperature of the quartz crystal resonator 400 is made hard to be transmitted to the resonating region 311c by deflecting the second region 311k of the resonator element 310.

As described hereinabove, according to the quartz crystal resonator 400 related to the present embodiment, since the resonating region 311c, the first bonding member 41, and the second bonding member 42 satisfy the relationship of 0<L1/L2≤0.97, the following advantage can be obtained in addition to the advantage in the quartz crystal resonator 100 according to the first embodiment. In the quartz crystal resonator 400 according to the present embodiment, the stress, which occurs due to the difference between the amount of expansion or contraction of the resonator element 310 and the amount of expansion or contraction of the bottom plate 21 due to the change in ambient temperature of the quartz crystal resonator 400, and is then transmitted to the resonating region 311c, is further reduced compared to the first embodiment. Therefore, it is possible to further reduce the characteristic variation such as the level of the hysteresis of the quartz crystal resonator 400 compared to the first embodiment.

It should be noted that although in the resonator element 310 according to the present embodiment, the centers of the excitation electrodes 412a, 413a, the resonating region center 311d, and the center of the first region 311h are arranged so as to roughly overlap each other viewed from above, this is not a limitation, and it is sufficient for the excitation electrodes 412a, 413a to be arranged so that the resonating region center 311d and the first region 311h overlap each other viewed from above. Further, the excitation electrodes 412a, 413a can also be arranged so that one of the excitation electrodes is arranged inside the other of the excitation electrodes, or can also be arranged so that both of the excitation electrodes overlap only the first region 311h viewed from above.

Modified Example of Resonator Element

In the resonator device according to the present embodiment, it is also possible for the resonator element to have a shape other than the shape of the resonator element 310 shown in FIG. 8A and FIG. 8B. Some modified examples of the resonator element will be described using FIG. 9A, FIG. 9B, FIG. 9C, FIG. 9D, and FIG. 9E. It should be noted that the same constituents as those of the resonator element 10 according to the first embodiment or those of the resonator element 310 according to the fourth embodiment are denoted by the same reference symbols and the explanation thereof will be omitted, and the parts different from those of the resonator element 10 according to the first embodiment or the resonator element 310 according to the fourth embodiment will mainly be described.

Figure 9A:
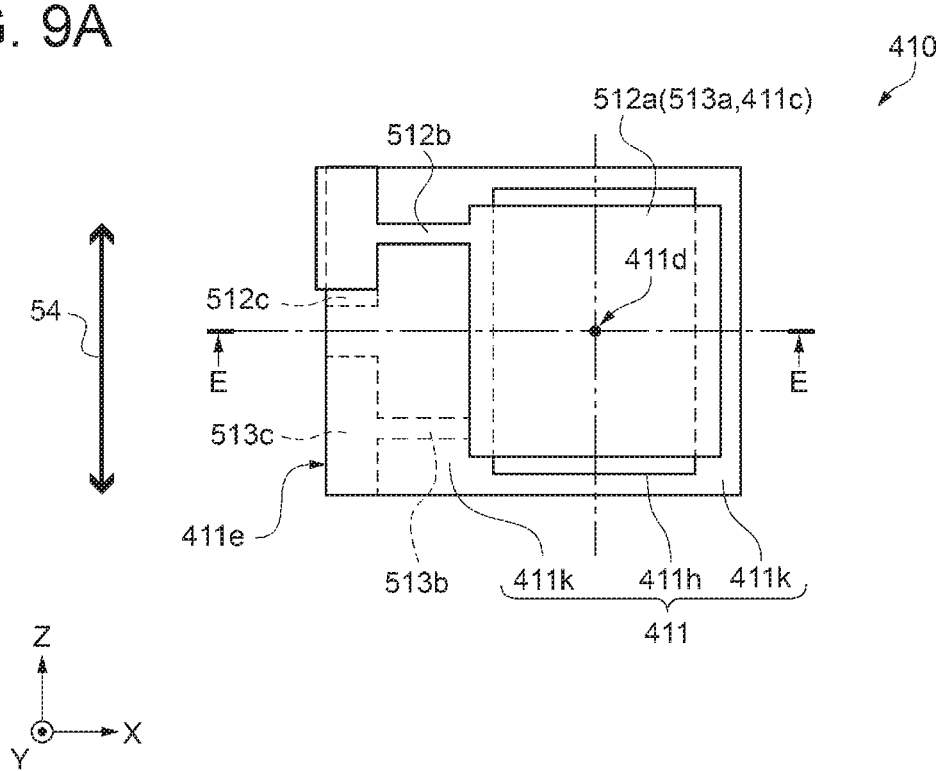
FIG. 9A is a plan view showing a schematic configuration of a modified example of a resonator element in the quartz crystal resonator as the resonator device according to the fourth embodiment.
Figure 9B:
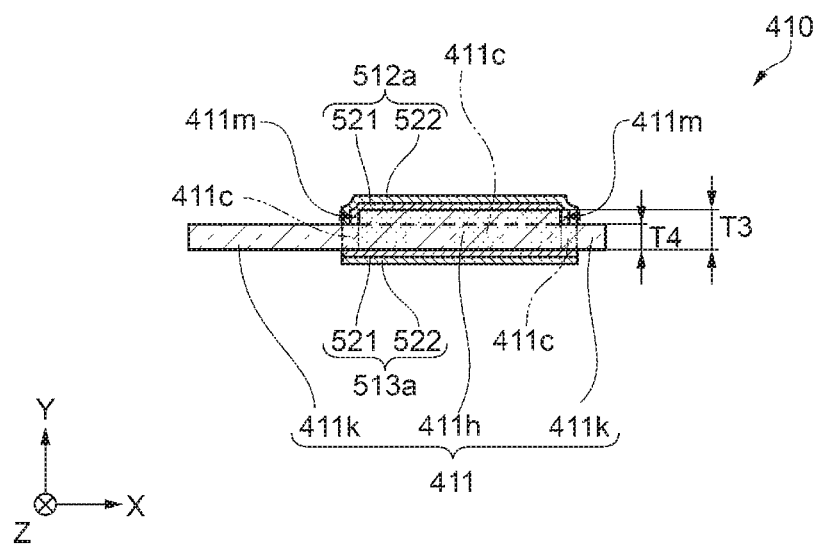
FIG. 9B is a cross-sectional view along the line E-E in FIG. 9A.
Figure 9C:
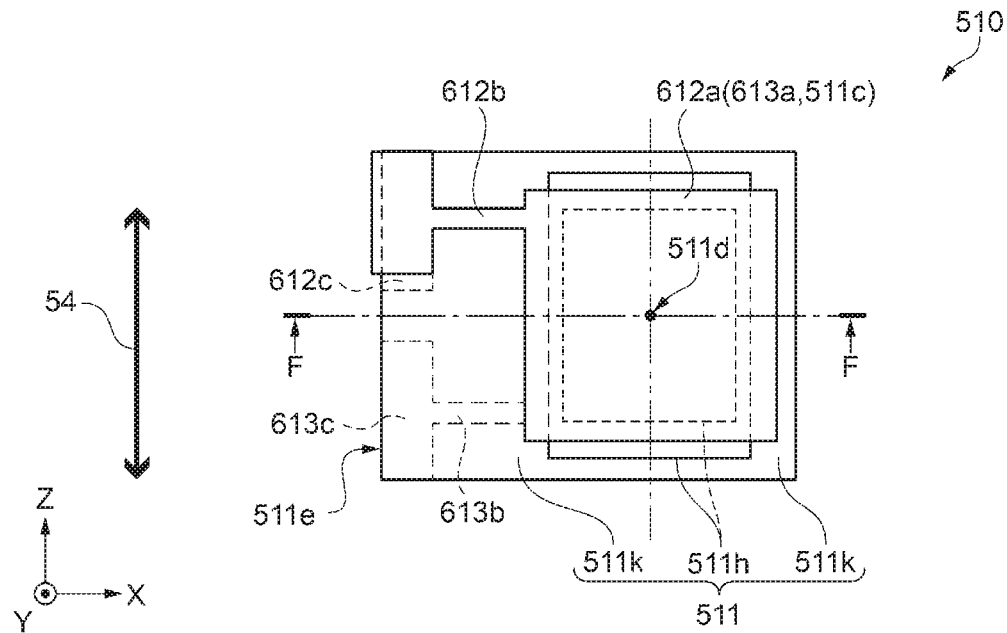
FIG. 9C is a plan view showing another modified example of the resonator element in the quartz crystal resonator as the resonator device according to the fourth embodiment.
Figure 9D:
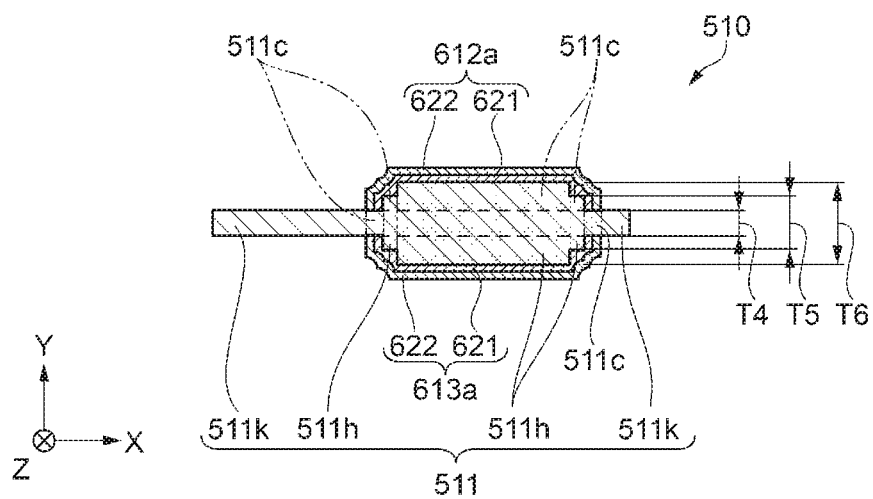
FIG. 9D is a cross-sectional view along the line F-F in FIG. 9C.
Figure 9E:
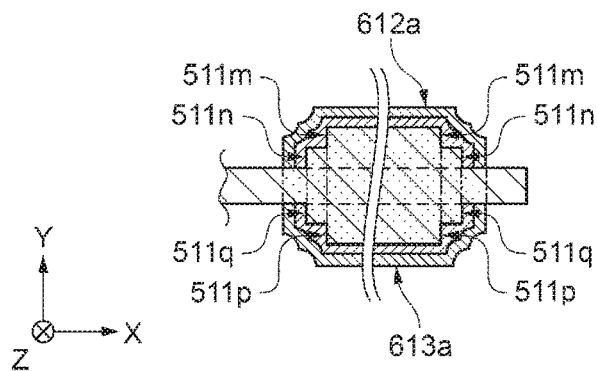
FIG. 9E is a partial enlarged cross-sectional view of an excitation electrode part shown in FIG. 9D.

FIG. 9A, FIG. 9B, FIG. 9C, FIG. 9D, and FIG. 9E are schematic diagrams showing the modified examples related to the present embodiment, wherein FIG. 9A is a plan view of a resonator element 410 as one of the modified examples, FIG. 9B is a cross-sectional view along the line E-E shown in FIG. 9A, FIG. 9C is a plan view of a resonator element 510 as another of the modified examples, FIG. 9D is a cross-sectional view along the line F-F shown in FIG. 9C, and FIG. 9E is a partial enlarged cross-sectional view of an excitation electrode part shown in FIG. 9D. It should be noted that in the following description, the explanation is presented assuming the upper side (the +Y-axis direction) in FIG. 9B and FIG. 9D as an "upper side," and the lower side (the −Y-axis direction) as a "lower side." Further, the explanation is presented assuming surfaces located on the upper side (the +Y-axis direction) of the members shown in FIG. 9B and FIG. 9D as upper surfaces, and surfaces located on the lower side (the −Y-axis direction) as lower surfaces.

As shown in FIG. 9A and FIG. 9B, in the resonator element 410, are upper surface of a first region 411h with the thickness T3 of a quartz crystal substrate 411 protrudes upward from an upper surface of a second region 411k with the thickness T4, and at the same time, the lower surface of the first region 411h and the lower surface of the second region 411k continue to form a plane. Excitation electrodes 512a, 513a are arranged so as to roughly overlap each other viewed from above. Further, the quartz crystal substrate 411 is provided with a resonating region 411c sandwiched by the excitation electrodes 512a, 513a, namely the region overlapping the excitation electrodes 512a, 513a in the quartz crystal substrate 411 shown in FIG. 9A, and the region with the net-like hatching in the quartz crystal substrate 411 shown in FIG. 9B. Further, the resonating region center 411d is arranged so as to roughly overlap the center of the first region 411h.

Further, the excitation electrode 512a is arranged continuously on the upper surface of the first region 411h, a side surface 411m connecting the upper surface of the first region 411h and the upper surface of the second region 411k to each other, and the upper surface of the second region 411k in the direction crossing the first direction 54.

Similarly to the fourth embodiment, the excitation electrodes 512a, 513a, extraction electrodes 512b, 513b, and connection electrodes 512c, 513c are each formed of at least two layers including a foundation layer (a first metal layer 521) and an upper layer (a second metal layer 522). As the constituent materials of the first metal layer 521 and the second metal layer 522, there are used materials satisfying $|(\alpha2-\alpha1)/\alpha1|\leq0.35$ and $|(\alpha3-\alpha1)/\alpha1|\leq0.35$ defining the linear expansion coefficient of the first metal layer 521 as α1, the linear expansion coefficient of the second metal layer 522 as α2, and the linear expansion coefficient of the quartz crystal substrate 411, which is a base member, as α3. By adopting such an electrode configuration, similarly to the first embodiment, even in the case in which, for example, the ambient temperature of the quartz crystal resonator element 410 varies, it is possible to reduce the stress generated between the first metal layer 521 and the quartz crystal substrate 411, and the stress generated between the first metal layer 521 and the second metal layer 522.

As shown in FIG. 9C and FIG. 9D, in the resonator element 510, the first region 511h of the quartz crystal substrate 511 has a region with a thickness T5 thicker than the thickness T4 of the second region 511k, and a region with a thickness T6 thicker than the thickness T5. Further, excitation electrode 612a and excitation electrode 613a are arranged so as to overlap the region with the thickness T6 and the region with the thickness T5 of the first region 511h, and the second region 511k. Further, the quartz crystal substrate 511 is provided with a resonating region 511c sandwiched by the excitation electrodes 612a, 613a, namely the region overlapping the excitation electrodes 612a, 613a in the quartz crystal substrate 511 shown in FIG. 9C, and the region with the net-like hatching in the quartz crystal substrate 511 shown in FIG. 9D. Further, the resonating region center 511d is arranged so as to overlap the region with the thickness T6 of the first region 511h.

Further, as shown in FIG. 9D and FIG. 9E, the excitation electrode 612a is arranged continuously on the upper surface of the region with the thickness T6 of the first region 511h, a side surface 511m connecting the upper surface of the region with the thickness T6 of the first region 511h and the upper surface of the region with the thickness T5 to each other, an upper surface of the region with the thickness T5 of the first region 511h, a side surface 511n connecting the upper surface of the region with the thickness T5 of the first region 511h and an upper surface of the second region 511k to each other, and the upper surface of the second region 511k in the direction crossing the first direction 54. The excitation electrode 613a is arranged continuously on the lower surface of the region with the thickness T6 of the first region 511h, a side surface 511p connecting the lower surface of the region with the thickness T6 of the first region 511h and the lower surface of the region with the thickness T5 to each other, a lower surface of the region with the thickness T5 of the first region 511h, a side surface 511q connecting the lower surface of the region with the thickness T5 of the first region 511h and a lower surface of the second region 511k to each other, and the lower surface of the second region 511k in the direction crossing the first direction 54.

Further, similarly to the fourth embodiment, the excitation electrodes 612a, 613a, extraction electrodes 612b, 613b, and connection electrodes 612c, 613c are each formed of at least two layers including a foundation layer (a first metal layer 621) and an upper layer (a second metal layer 622). As the constituent materials of the first metal layer 621 and the second metal layer 622, there are used materials satisfying $|(\alpha2-\alpha1)/\alpha1|\leq0.35$ and $|(\alpha3-\alpha1)/\alpha1|\leq0.35$ defining the linear expansion coefficient of the first metal layer 621 as α1, the linear expansion coefficient of the second metal layer 622 as α2, and the linear expansion coefficient of the quartz crystal substrate 511, which is a base member, as α3. By adopting such an electrode configuration, similarly to the first embodiment, even in the case in which, for example, the ambient temperature of the resonator element 510 varies, it is possible to reduce the stress generated between the first metal layer 621 and the quartz crystal substrate 511, and the stress generated between the first metal layer 621 and the second metal layer 622.

Also in the quartz crystal resonator 400 using the resonator element 410 or the resonator element 510 according to the modified examples described above, substantially the same advantage as that of the quartz crystal resonator 400 according to the present embodiment using the resonator element 310 can be obtained.

It should be noted that although in the resonator element 410 according to the modified example described above, the centers of the excitation electrodes 512a, 513a, the resonating region center 411d, and the center of the first region 411h are arranged so as to roughly overlap each other viewed from above, this is not a limitation, and it is sufficient for the excitation electrodes 512a, 513a to be arranged so that the resonating region center 411d and the first region 411h overlap each other viewed from above. Further, the excitation electrodes 512a, 513a can also be arranged so that one of the excitation electrodes is arranged inside the other of the excitation electrodes, or can also be arranged so that both of the excitation electrodes overlap only the first region 411h viewed from above.

Further, although in the resonator element 510 according to the modified example described above, the centers of the excitation electrodes 612a, 613a, the resonating region center 511d, and the center of the first region 511h are arranged so as to roughly overlap each other viewed from above, this is not a limitation, and it is sufficient for the excitation electrodes 612a, 613a to be arranged so that the resonating region center 511d and the region with the thickness T6 of the first region 511h overlap each other viewed from above. Further, the excitation electrodes 612a, 613a can also be arranged so that one of the excitation electrodes is arranged inside the other of the excitation electrodes, or can also be arranged so that both of the excitation electrodes overlap only the first region 511h viewed from above.

Fifth Embodiment

A quartz crystal resonator 500 will be described as an example of a resonator device according to a fifth embodiment. It should be noted that the constituents identical to those of the quartz crystal resonator 100 according to the first embodiment described above are denoted by the same reference symbols, and the explanation thereof will be omitted, while the sections different from those of the quartz crystal resonator 100 according to the first embodiment described above will mainly be described.

Figure 10A:
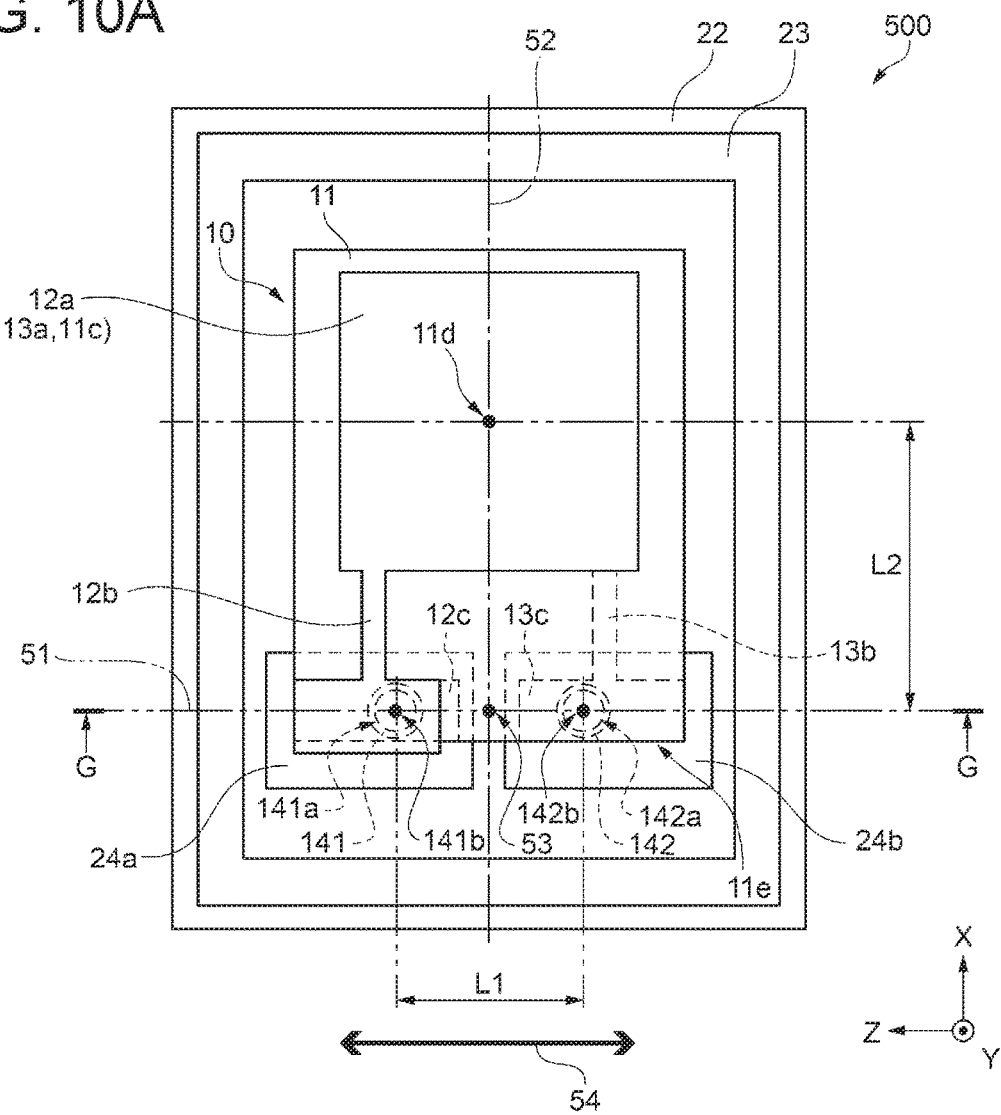
FIG. 10A is a plan view showing a schematic configuration of a quartz crystal resonator as a resonator device according to a fifth embodiment of the invention.
Figure 10B:
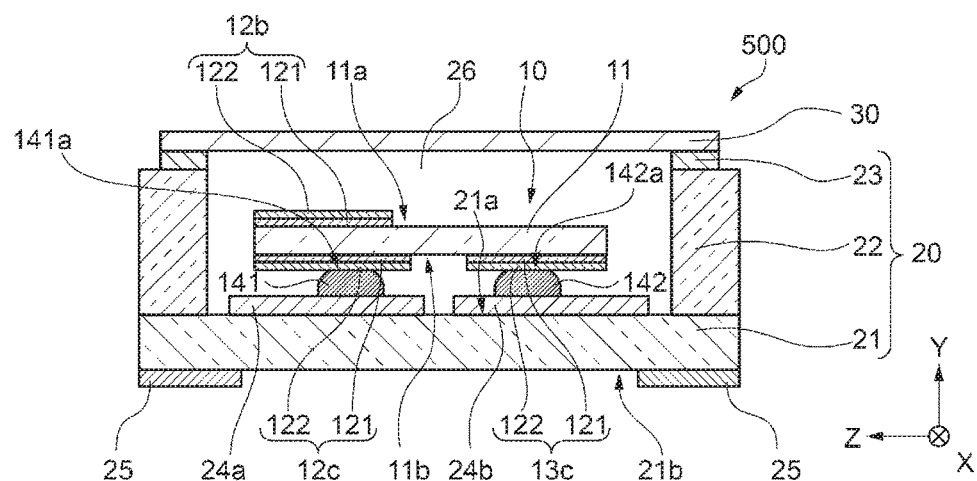
FIG. 10B is a cross-sectional view along the line G-G in FIG. 10A.

FIG. 10A and FIG. 10B are schematic diagrams of the quartz crystal resonator 500 as the resonator device according to the fifth embodiment, wherein FIG. 10A is a plan view, and FIG. 10B is a cross-sectional view along the line G-G shown in FIG. 10A.

As shown in FIG. 10A and FIG. 10B, the quartz crystal resonator 500 is constituted by the resonator element 10, the package 20, a first bonding member 141, a second bonding member 142, the lid 30 as the lid member, and so on. It should be noted that in FIG. 10A, the lid 30 is omitted from the drawing for the sake of convenience of explanation.

Resonator Element

The resonator element 10 includes the quartz crystal substrate 11 as a base member, the pair of excitation electrodes 12a, 13a, the extraction electrodes 12b, 13b, and the connection electrodes 12c, 13c. A predetermined alternating-current voltage is applied to the excitation electrodes 12a, 13a, and thus, the resonator element 10 vibrates with a predetermined resonance frequency.

Similarly to the first embodiment, the excitation electrodes 12a, 13a, the extraction electrodes 12b, 13b, and the connection electrodes 12c, 13c are each formed of at least two layers including the foundation layer (the first metal layer 121) and the upper layer (the second metal layer 122). The first metal layer 121 as the foundation layer is disposed on the quartz crystal substrate 11, namely on the quartz crystal substrate 11 side, and the second metal layer 122 as the upper layer is disposed on the first metal layer 121, namely on the opposite side to the quartz crystal substrate 11 side. It should be noted that the constituent materials of the first metal layer 121 and the second metal layer 122 are substantially the same as in the first embodiment, and therefore, the explanation thereof will be omitted.

Bonding Member

As shown in FIG. 10A and FIG. 10B, the quartz crystal resonator 500 according to the present embodiment is different from the quartz crystal resonator 100 according to the first embodiment, and the first bonding member 141 and the second bonding member 142 are each formed of a metal bump. The first bonding member 141 has a first bonding center 141b on the connection electrode 12c side, namely on the upper surface 141a located on the resonator element 10 side. The second bonding member 142 has a second bonding center 142b on the connection electrode 13c side, namely on the upper surface 142a located on the resonator element 10 side.

The metal bumps are each formed by a plating method, a bonding method, or the like. In the plating method, by forming a predetermined pattern so that the first bonding member 141 and the second bonding member 142 are formed at predetermined positions of the resonator element 10 or the package 20, and then plating the pattern with the metal, it is possible to form the first bonding member 141 and the second bonding member 142 each formed of the metal bump.

Further, in the bonding method, by connecting metal wires (thin wires) made of gold (Au) or the like to the positions, at which the first bonding member 141 and the second bonding member 142 are formed, of the resonator element 10 or the package 20, and then cutting the wires to remove other parts than the parts thus connected, it is possible to form the first bonding member 141 and the second bonding member 142 each formed of the metal bump.

It should be noted that instead of the plating method or the bonding method described above, it is possible to adopt a method of forming the first bonding member 141 and the second bonding member 142 each formed of the metal bump by applying a paste (solvent) containing a metal material to the positions, at which the first bonding member 141 and the second bonding member 142 are formed, of the resonator element 10 or the package 20 by printing or dispensing, and then heating the resonator element 10 or the package 20, to which the paste is applied, to thereby volatilize the solvent component other than the metal.

The shape of the metal bump is not particularly limited, but can be a columnar shape (a cylindrical shape), a polygonal column, a circular truncated cone, or the like. Further, it is also possible for the metal wire to be formed of metal including silver (Ag), copper (Cu), aluminum (Al), platinum (Pt), or the like as a principal component, besides gold (Au). Further, the material of the metal member can be metal including gold (Au), silver (Ag), copper (Cu), aluminum (Al), platinum (Pt), or the like as a principal component, or an alloy such as lead-free solder or leaded solder.

In the case of the metal bump, emission of a gas from the inside of the metal bump due to heating or passage of time is reduced compared to a resin material such as an adhesive. Therefore, even in the case in which the quartz crystal resonator 500 is heated, or a certain time has elapsed after the shipment of the quartz crystal resonator 500, the emission of the gas from the first bonding member 141 and the second bonding member 142 is reduced compared to the case in which the first bonding member 141 and the second bonding member 142 are formed of a resin material.

Further, since the gas emitted from the first bonding member 141 and the second bonding member 142 is emitted to the internal space 26 set in the airtight state, the gas thus emitted adheres to the excitation electrodes 12a, 13a to increase the mass, or converts the excitation electrodes 12a, 13a to thereby vary the characteristics of the resonator element 10 such as a resonance frequency, a frequency-temperature characteristic, or an equivalent series resistance in some cases.

According to the fact described above, the gas to be emitted from the first bonding member 141 and the second bonding member 142 of the quartz crystal resonator 500 according to the present embodiment due to heating or passage of time is reduced compared to the gas emitted from the first bonding member 41 and the second bonding member 42 of the quartz crystal resonator 100 according to the first embodiment. Therefore, it is possible to reduce the variation of the characteristics of the quartz crystal resonator 500 such as the resonance frequency, the frequency-temperature characteristic, or the equivalent series resistance compared to the quartz crystal resonator 100 according to the first embodiment.

As described hereinabove, according to the quartz crystal resonator 500 related to the present embodiment, since the resonating region 11c, the first bonding member 141, and the second bonding member 142 satisfy the relationship of 0<L1/L2≤0.97, the following advantage can be obtained in addition to the advantage in the quartz crystal resonator 100 according to the first embodiment. Compared to the quartz crystal resonator 100 according to the first embodiment, the quartz crystal resonator 500 is capable of reducing the emission of the gas from the first bonding member 141 and the second bonding member 142, and is thus capable of reducing the characteristic variation of the quartz crystal resonator 500 such as variations of the output frequency, the frequency-temperature characteristic, and the equivalent series resistance.

It should be noted that although in the present embodiment, the first bonding member 141 and the second bonding member 142 are formed the metal bumps, even in the case in which at least one of the first bonding member 141 and the second bonding member 142 is formed of the metal bump, and the other of the bonding members is formed of a electrically-conductive or nonconductive adhesive, substantially the same advantage as in the present embodiment can be obtained on the grounds described above.

Further, in the case of forming the first bonding member 141 and the second bonding member 142 with the metal bumps, the upper surface 141a of the first bonding member 141 and the upper surface 142a of the second bonding member 142 can be formed so as to have a diameter equal to or smaller than 0.05 mm, and therefore, it is preferable for the lower limit value of the distance L1 to be larger than 0.05 mm as the range in which the first bonding member 141 and the second bonding member 142 is not electrically connected to each other. In other words, it is preferable for the ratio L1/L2 to satisfy the relationship of 0.065<L1/L2≤0.97.

It should be noted that the invention is not limited to the embodiments described above, but it is possible to provide a variety of modifications or improvements to the embodiments described above, or combine two or more embodiments described above with each other.

Sixth Embodiment

Then, an oscillator according to a sixth embodiment equipped with either one of the quartz crystal resonators 100, 200, 300, 400, and 500 according respectively to the first through fifth embodiments of the resonator device described above will be described with reference to FIG. 11A and FIG. 11B. It should be noted that in the description of the oscillator according to the present embodiment, there is shown an example using the quartz crystal resonator 100 according to the first embodiment as the resonator device.

Figure 11A:
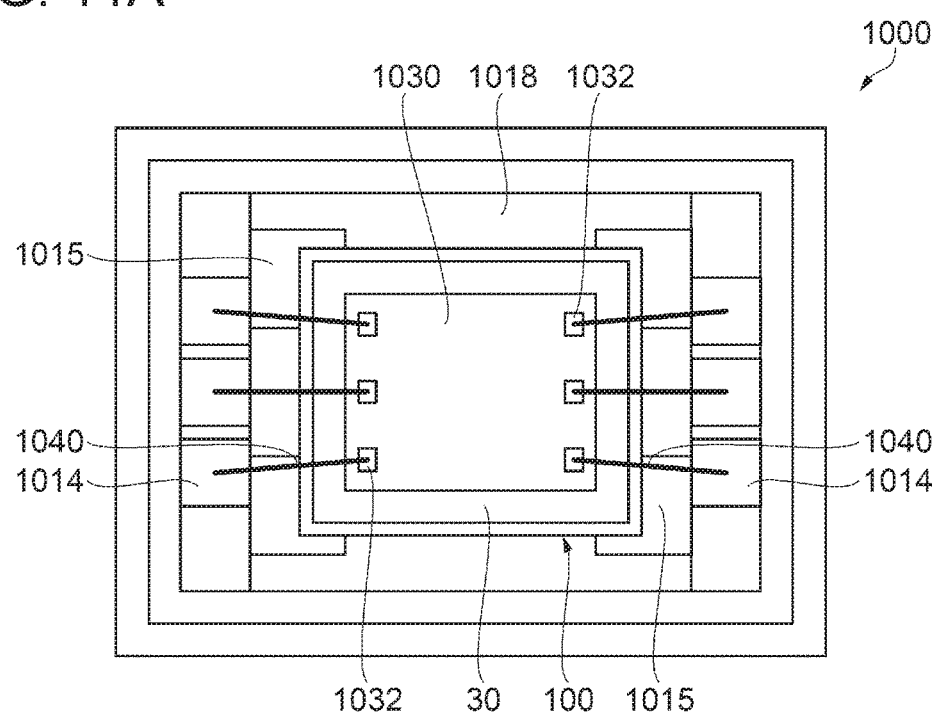
FIG. 11A is a plan view showing a schematic configuration of an oscillator according to a sixth embodiment of the invention.

FIG. 11A and FIG. 11B are schematic configuration diagram showing an outline of the configuration of the quartz crystal oscillator 1000 equipped with the quartz crystal resonator 100 according to an embodiment of the invention as an example of the oscillator, wherein FIG. 11A is a plan view, and FIG. 11B shows a cross-sectional view along the line H-H shown in FIG. 11A. It should be noted that in FIG. 11A, the lid 1020 is omitted from the drawing for the sake of convenience of explanation. Further, in the following description, it is assumed that the upper side of FIG. 11B is an "upper side," and the lower side thereof is a "lower side." Further, the explanation will be presented assuming a surface located on the upper side of each member in FIG. 11B as an upper surface, and a surface located on the lower side as a lower surface.

As shown in FIG. 11A and FIG. 11B, the quartz crystal oscillator 1000 is constituted by the quartz crystal resonator 100, a lid 1020 as a second lid member, an oscillation circuit element 1030 as a circuit element, bonding wires 1040, a container 1050, and so on. It should be noted that the quartz crystal resonator 100 as an example of the resonator device has the resonator element 10 (see FIG. 1A), the first bonding member 41 (see FIG. 1A), the second bonding member 42 (see FIG. 1A), and so on housed in the internal space 26 (see FIG. 1A) defined in the central part of the package 20 (see FIG. 1A) by the package 20 and the lid 30 as the first lid member, as described above.

The container 1050 is constituted by the first substrate (the bottom plate) 1010, a first sidewall 1011a, a second sidewall 1011b, a sealing ring 1012, and so on. Specifically, the container 1050 is provided with an internal space 1018 having a shape recessed in a central part by stacking a first sidewall 1011a in the peripheral edge of the upper surface of the first substrate (the bottom plate) 1010, then stacking a second sidewall 1011b in the peripheral edge of the upper surface of the first sidewall 1011a. In the internal space 1018, there are housed the quartz crystal resonator 100, the oscillation circuit element 1030 as the circuit element, and so on. It should be noted that the outer shape of the container 1050 is not limited, but can also be provided with, for example, a rectangular solid shape or a cylindrical shape. Further, on the lower surface of the first substrate (the bottom plate) 1010 as the external surface of the container 1050, there is provided a plurality of external connection terminals 1016.

Further, it is preferable that the first substrate (the bottom surface) 1010, the first sidewall 1011a, and the second sidewall 1011b configuring the container 1050 are formed of a material provided with a thermal expansion coefficient coinciding with or approximate to the thermal expansion coefficient of the package 20 (not shown) of the quartz crystal resonator 100 and the lid 1020 as the second lid member, and ceramic is used in the present embodiment.

The sealing ring 1012 is formed of, for example, a metal brazing material such as a gold brazing material or a silver brazing material, glass, or metal such as Kovar as the bonding material between the second sidewall 1011b and the lid 1020, and is disposed along the upper surface of the second sidewall 1011b so as to have a frame shape.

In the internal space 1018 of the container 1050, there are disposed a plurality of connection terminals 1015 disposed on the upper surface of the first substrate (the bottom plate) 1010 and a plurality of internal connection terminals 1014 disposed on the upper surface of the first sidewall 1011a. The internal connection terminals 1014 and the external connection terminals 1016 are electrically connected to each other via internal interconnections not shown, respectively.

The quartz crystal resonator 100 is mounted on the first substrate (the bottom plate 1010), which is the internal space 1018 side of the container 1050, and is electrically connected to the internal connection terminals 1014 via the connection terminals 1015 and the internal interconnections not shown.

The oscillation circuit element 1030 as the circuit element is provided with an electrical circuit for oscillating the quartz crystal resonator 100. The oscillation circuit element 1030 has a plurality of pads 1032 disposed on the upper surface thereof, and is connected to the upper surface of the lid 30, which is the upper surface of the quartz crystal resonator 100, with the connection members 1034 such as an adhesive or solder.

The plurality of bonding wires 1040 is the metal wires (thin wires) made of gold (Au), and electrically connects the pads 1032 of the oscillation circuit element 1030 and the internal connection terminals 1014 to each other.

The lid 1020 as the second lid member has a plate-like shape covering the opening of the container 1050, and is formed of, for example, metal such as Kovar or 42-alloy, ceramic, or glass. The lid 1020 is bonded (sealed) to the sealing ring 1012 so that the internal space 1018 becomes in the airtight state after the quartz crystal resonator 100, the oscillation circuit element 1030, and so on are housed in the internal space 1018 of the container 1050. The inner pressure of the internal space 1018 set to the airtight state is set to a desired value. For example, by setting the internal space 1018 to a vacuum state (a state of the pressure (lower than $1 \times 10^5$ Pa through $1 \times 10^{-10}$ Pa (JIS Z 8126-1:1999)) lower than the atmospheric pressure), or by setting the internal space 1018 to a pressure state equivalent to the atmospheric pressure filled with an inert gas such as nitrogen or argon, it becomes possible to continue the stable vibration of the resonator element 100 without deteriorating the function of the oscillation circuit element 1030.

In the quartz crystal oscillator 1000, a voltage for operating the oscillation circuit element 1030 is applied to at least one terminal out of the external connection terminals 1016, and then, an oscillation signal output from the oscillation circuit element 1030 is output from at least one of other external connection terminals 1016.

As described above, since the quartz crystal oscillator 1000 as the oscillator is equipped with the quartz crystal resonator 100 according to the embodiment of the invention, the stable frequency signal is output from the quartz crystal resonator 100 as the reference frequency source of the oscillator. Therefore, the reliability of the operation of the quartz crystal oscillator 1000 can be improved.

Further, in the quartz crystal oscillator 1000, the quartz crystal resonator 100, which has the resonator element 10 and so on housed in the internal space 26 of the package 20 defined by the bottom plate 21 as the base substrate and the lid 30 as the first lid member as shown in FIG. 1A and FIG. 1B, is encapsulated together with the oscillation circuit element 1030 in the internal space 1018 of the container 1050 defined by the second sidewall 1011b and the lid 1020 as the second lid member as shown in FIG. 11A and FIG. 11B. Therefore, it results that the resonator element 10, the first bonding member 41, and the second bonding member 42 are encapsulated by a dual container (the package 20 and the container 1050), and even in the case in which the ambient temperature has changed, it becomes hard for the change to reach the resonator element 10, the first bonding member 41 and the second bonding member 42, and thus, it is possible to further reduce the characteristic variation such as the hysteresis of the quartz crystal resonator 100. Therefore, it becomes possible to provide the quartz crystal oscillator 1000 more stable in characteristics.

Seventh Embodiment

Then, an electronic apparatus according to a seventh embodiment equipped with either one of the quartz crystal resonators 100, 200, 300, 400, and 500 according respectively to the first through fifth embodiments will be described with reference to FIG. 12 through FIG. 14. It should be noted that in the description of the present embodiment, there is shown an example using the quartz crystal resonator 100 according to the first embodiment as the resonator device.

FIG. 12 is a perspective view showing an outline of a configuration of a mobile type (or a laptop type) personal computer 1100 as an example of the electronic apparatus equipped with the quartz crystal resonator 100 according to the first embodiment. As shown in FIG. 12, the personal computer 1100 is constituted by a main body 1104 equipped with a keyboard 1102, and a display unit 1108 equipped with a display 1106, and the display unit 1108 is pivotally supported with respect to the main body 1104 via a hinge structure. Such a personal computer 1100 incorporates the quartz crystal resonator 100.

As described above, by providing the mobile type (or laptop type) personal computer 1100 as an example of the electronic apparatus with the quartz crystal resonator 100 according to the embodiment of the invention as, for example, a clock source, a stable frequency signal is output from the quartz crystal resonator 100 as the clock source supplied to the mobile type personal computer 1100. Therefore, the reliability of the operation of the mobile type personal computer 1100 can be improved.

Figure 13:
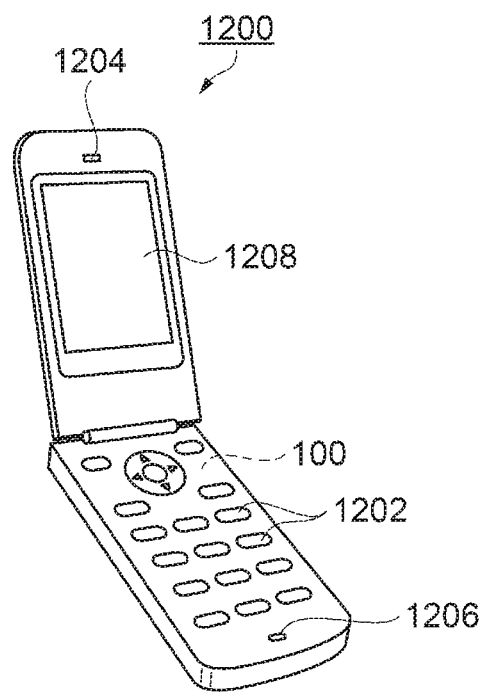
FIG. 13 is a perspective view showing a cellular phone as the electronic apparatus according to the seventh embodiment.

FIG. 13 is a perspective view showing an outline of a configuration of a cellular phone 1200 (including PHS) as an example of the electronic apparatus equipped with the quartz crystal resonator 100 according to the first embodiment. As shown in FIG. 13, the cellular phone 1200 is provided with a plurality of operation buttons 1202, an ear piece 1204, and a mouthpiece 1206, and a display 1208 is disposed between the operation buttons 1202 and the earpiece 1204. Such a cellular phone 1200 incorporates the quartz crystal resonator 100.

As described above, by providing the cellular phone 1200 (including PHS) as an example of the electronic apparatus with the quartz crystal resonator 100 according to the embodiment of the invention as, for example, a clock source, a stable frequency signal is output from the quartz crystal resonator 100 as the clock source supplied to the cellular phone 1200. Therefore, the reliability of the operation of the cellular phone 1200 can be improved.

Figure 14:
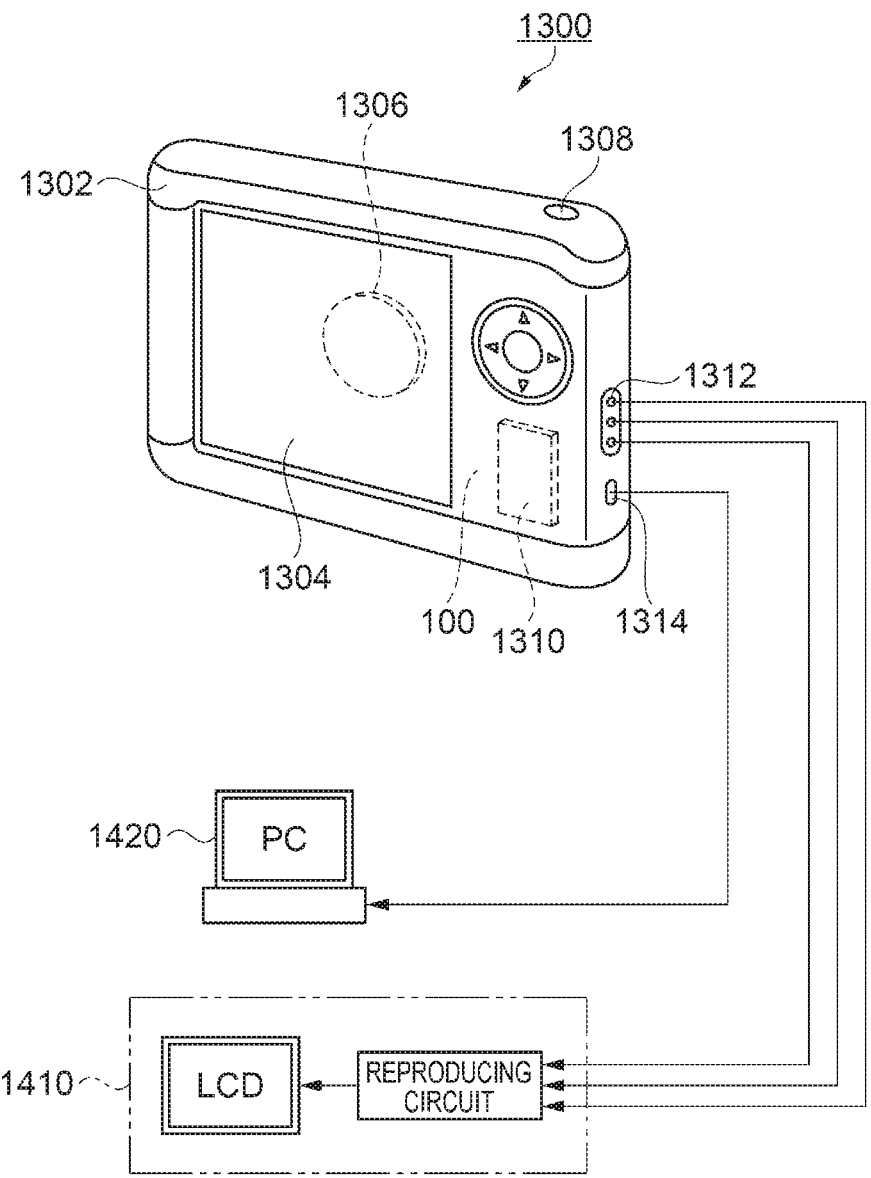
FIG. 14 is a perspective view showing a digital camera as the electronic apparatus according to the seventh embodiment.

FIG. 14 is a perspective view showing an outline of a configuration of a digital still camera 1300 as the electronic apparatus equipped with the quartz crystal resonator 100 according to the first embodiment. It should be noted that FIG. 14 also shows the connection to an external device in a simplified manner. Here, conventional film cameras expose silver salt films to optical images of objects, while the digital camera 1300 performs photoelectric conversion on optical images of objects by imaging elements such as CCD (charge coupled device) to generate imaging signals (image signals).

A case 1302 (a body) of the digital camera 1300 is provided with a display 1304 disposed on the back surface thereof to have a configuration of performing display in accordance with the imaging signal from the CCD, wherein the display 1304 functions as a viewfinder for displaying the object as an electronic image. Further, the front surface (the back side in the drawing) of the case 1302 is provided with a light receiving unit 1306 including an optical lens (an imaging optical system), the CCD, and so on.

When the photographer checks an object image displayed on the display 1304, and then holds down a shutter button 1308, the imaging signal from the CCD at that moment is transferred to and stored in a memory 1310. Further, the digital camera 1300 is provided with video signal output terminals 1312 and an input/output terminal 1314 for data communication disposed on a side surface of the case 1302. Further, as shown in the drawing, a television monitor 1410 and a personal computer 1420 are respectively connected to the video signal output terminals 1312 and the input-output terminal 1314 for data communication according to needs. Further, there is adopted the configuration in which the imaging signal stored in the memory 1310 is output to the television monitor 1410 and the personal computer 1420 in accordance with a predetermined operation. Such a digital camera 1300 incorporates the quartz crystal resonator 100.

As described above, by providing the digital camera 1300 as an example of the electronic apparatus with the quartz crystal resonator 100 according to the embodiment of the invention as, for example, a clock source, a stable frequency signal is output from the quartz crystal resonator 100 as the clock source supplied to the digital camera 1300. Therefore, the reliability of the operation of the digital camera 1300 can be improved.

It should be noted that the quartz crystal resonator 100 according to the first embodiment can also be applied to other electronic apparatus besides the personal computer 1100 (the mobile type personal computer) shown in FIG. 12, the cellular phone 1200 shown in FIG. 13, and the digital camera 1300 shown in FIG. 14.

As another example of the electronic apparatus according to the present embodiment, there can be cited a transmission device using the quartz crystal oscillator 1000 described above as a reference signal source, a voltage controlled oscillator (VCO), and so on and functioning as, for example, a mobile terminal base station device for performing communication with terminals wirelessly or with wire. By applying, for example, the quartz crystal resonators 100, 200, 300, 400, and 500 according to the respective embodiments described above as the resonator, or by applying the quartz crystal oscillator 1000 according to the embodiment described above, the stable frequency signal is output from the quartz crystal resonators 100, 200, 300, 400, and 500 or the quartz crystal oscillator 1000 as the clock source supplied to the transmission device. Therefore, the electronic apparatus according to the present embodiment can be applied to a transmission apparatus required to have a high performance and a high reliability, which can be used for, for example, a communication base station.

Further, as example of other electronic apparatus, there can be cited an inkjet ejection device (e.g., an inkjet printer), a laptop personal computer, a tablet personal computer, a storage area network apparatus such as a router or a switch, a local area network apparatus, a mobile communication base station apparatus, a television set, a video camera, a video recorder, a car navigation system, a real-time clock device, a pager, a personal digital assistance (including one having a communication function), an electronic dictionary, an electronic calculator, an electronic game machine, a word processor, a workstation, a picture phone, a security television monitor, an electronic binoculars, a POS terminal, a medical instrument (e.g., an electronic thermometer, a blood pressure monitor, a blood glucose monitor, an electrocardiograph, ultrasonic diagnostic equipment, and an electronic endoscope), a fish finder, a variety of measuring instruments, gauges (e.g., gauges for cars, aircrafts, and boats and ships), a flight simulator, a head-mount display, a motion tracer, a motion tracker, a motion controller, and a pedestrian dead reckoning (PDR) system, and so on.

Eighth Embodiment

Figure 15:
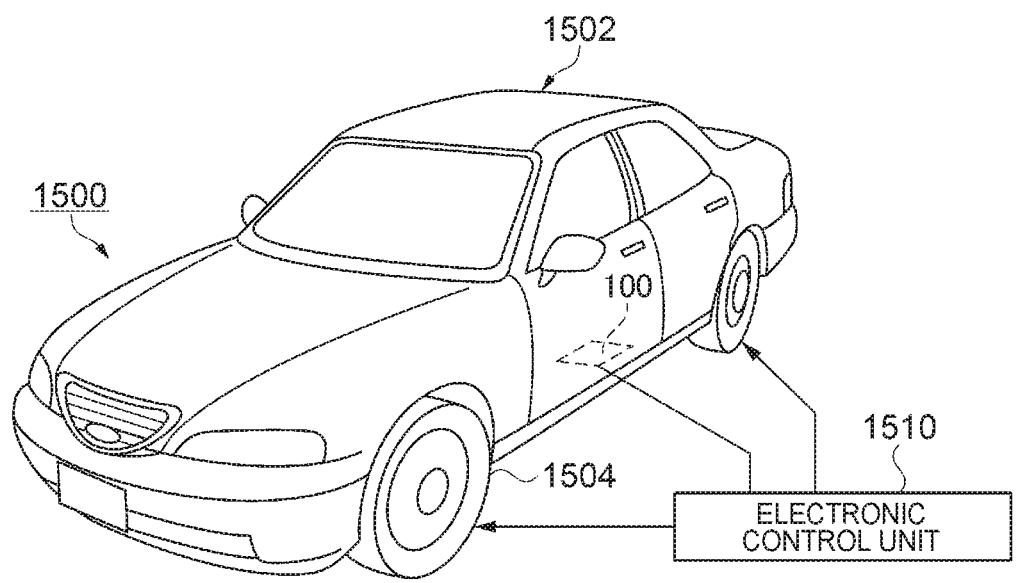
FIG. 15 is a perspective view showing a vehicle as a vehicle according to an eighth embodiment of the invention.

Then, a vehicle according to an eighth embodiment equipped with either one of the quartz crystal resonators 100, 200, 300, 400, and 500 according respectively to the first through fifth embodiments will be described using FIG. 15. It should be noted that in the description of the present embodiment, there is shown an example using the quartz crystal resonator 100 according to the first embodiment as the resonator device. FIG. 15 is a perspective view schematically showing a vehicle 1500 as an example of the vehicle equipped with the quartz crystal resonator 100 according to the first embodiment of the invention.

The vehicle 1500 is equipped with the quartz crystal resonator 100 according to the first embodiment. As shown in FIG. 15, in the vehicle 1500 as the vehicle, an electronic control unit 1510 incorporating the quartz crystal resonator 100 and for controlling tires 1504 and so on is installed in a vehicle body 1502. Further, besides the above, the quartz crystal resonator 100 according to the embodiment of the invention can widely be applied to an electronic control unit (ECU) such as a keyless entry system, an immobilizer, a car navigation system, a car air-conditioner, an anti-lock braking system (ABS), an air-bag system, a tire pressure monitoring system (TPMS), an engine controller, a braking system, a battery monitor for a hybrid car or an electric car, or a vehicle attitude control system.

As described above, by providing the vehicle 1500 as an example of the vehicle with the quartz crystal resonator 100 according to the embodiment of the invention as, for example, a clock source, a stable frequency signal is output from the quartz crystal resonator 100 as the clock source supplied to at least one of the vehicle 1500 and the electronic control unit 1510. Therefore, the reliability of the operation of at least one of the vehicle 1500 and the electronic control unit 1510 can be improved.

What is claimed is:

1. A resonator device comprising:
   a substrate;
   a resonator element including;
      a base member having a first surface and a second surface opposed to each other; and
      a pair of excitation electrodes respectively disposed on the first surface and the second surface and including a first metal layer and a second metal layer disposed on an opposite side of the first metal layer to the base member; and
   a first bonding member and a second bonding member arranged in a first direction along a first side of the resonator element, and bond the substrate and the resonator element to each other,
   wherein defining a center of a surface on the resonator element side of the first bonding member as a first bonding center, a center of a surface on the resonator element side of the second bonding member as a second bonding center, a center of a resonating region sandwiched by the pair of excitation electrodes in a planar view viewed from a direction perpendicular to a surface of the pair of excitation electrodes as a resonating region center, and
   defining a distance between the first bonding center and the second bonding center as L1, a length of a perpendicular drawn from the resonating region center to an imaginary line connecting the first bonding center and the second bonding center to each other as L2, a linear expansion coefficient of the first metal layer as $\alpha 1$, a linear expansion coefficient of the second metal layer as $\alpha 2$, a linear expansion coefficient of the base member as $\alpha 3$, and a length in the first direction of the resonator element as L3,
   $0 < L1/L2 \leq 0.97$, $|(\alpha 2 - \alpha 1)/\alpha 1| \leq 0.35$, $|(\alpha 3 - \alpha 1)/\alpha 1| \leq 0.35$, and $L3 \leq 1.5$ mm are satisfied.

2. The resonator device according to claim 1, wherein $0 < L1/L2 \leq 0.85$ is satisfied.

3. The resonator device according to claim 1, wherein the resonator element includes a first region having a first thickness in a direction perpendicular to a surface of the pair of excitation electrodes, and a second region having a thickness thinner than the first thickness, and the resonating region center overlaps the first region in the planar view, and the first bonding center and the second bonding center overlap the second region in the planar view.

4. The resonator device according to claim 1, wherein defining a length dimension of the resonator element in a direction crossing the first direction as L4, $L4 \leq 1.8$ mm is satisfied.

5. The resonator device according to claim 1, wherein the base member is made of a quartz crystal, the first metal layer is made of one of nickel (Ni) and an alloy including nickel (Ni) as a principal component, and the second metal layer is made of one of gold (Au) and an alloy including gold (Au) as a principal component.

6. An oscillator comprising:
   the resonator device according to claim 1;
   a first lid member;
   a circuit element including an oscillation circuit adapted to oscillate the resonator device,
   a container that houses the resonator device, the first lid member, and the circuit element, and
   a second lid member that seals the container,
   wherein the first lid member is disposed on an opposite side to the substrate with respect to the resonator element, the first bonding member, and the second bonding member, the first lid member is attached with the circuit element, the circuit element being connected on an opposite side to the substrate of the first lid member via a connection member.

7. An electronic apparatus comprising:
the resonator device according to claim 1.

8. A vehicle comprising:
the resonator device according to claim 1.

* * * * *